(12) United States Patent
Liu et al.

(10) Patent No.: US 12,249,583 B2
(45) Date of Patent: Mar. 11, 2025

(54) PACKAGE STRUCTURE, ASSEMBLY STRUCTURE AND METHOD FOR MANUFACTURING THE SAME

(71) Applicant: Advanced Semiconductor Engineering, Inc., Kaohsiung (TW)

(72) Inventors: Syu-Tang Liu, Kaohsiung (TW); Min Lung Huang, Kaohsiung (TW); Huang-Hsien Chang, Kaohsiung (TW); Tsung-Tang Tsai, Kaohsiung (TW); Ching-Ju Chen, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 18/234,300

(22) Filed: Aug. 15, 2023

(65) Prior Publication Data

US 2024/0021540 A1    Jan. 18, 2024

Related U.S. Application Data

(63) Continuation of application No. 16/656,331, filed on Oct. 17, 2019, now Pat. No. 11,728,282.

(51) Int. Cl.
*H01L 23/00* (2006.01)
*H01L 21/48* (2006.01)
(Continued)

(52) U.S. Cl.
CPC ........ *H01L 23/562* (2013.01); *H01L 21/4853* (2013.01); *H01L 21/4857* (2013.01);
(Continued)

(58) Field of Classification Search
None
See application file for complete search history.

(56) References Cited

U.S. PATENT DOCUMENTS

| 6,570,248 | B1 | 5/2003 | Ahn et al. |
| 6,757,967 | B2 | 7/2004 | Jimarez et al. |

(Continued)

FOREIGN PATENT DOCUMENTS

KR    10-2397902 B1    5/2022

OTHER PUBLICATIONS

Final Office Action for U.S. Appl. No. 16/656,331, issued Dec. 13, 2021, 16 pages.
(Continued)

*Primary Examiner* — Nishath Yasmeen
(74) *Attorney, Agent, or Firm* — FOLEY & LARDNER LLP

(57) ABSTRACT

A package structure includes a wiring structure, a first electronic device, a second electronic device and a reinforcement structure. The wiring structure includes at least one dielectric layer, and at least one circuit layer in contact with the dielectric layer. The at least one circuit layer includes at least one interconnection portion. The first electronic device and the second electronic device are electrically connected to the wiring structure. The second electronic device is electrically connected to the first electronic device through the at least one interconnection portion of the at least one circuit layer. The reinforcement structure is disposed above the at least one interconnection portion of the at least one circuit layer.

18 Claims, 28 Drawing Sheets

(51) Int. Cl.
*H01L 21/56* (2006.01)
*H01L 23/31* (2006.01)
*H01L 23/367* (2006.01)
*H01L 23/538* (2006.01)

(52) U.S. Cl.
CPC ........ *H01L 21/4871* (2013.01); *H01L 21/565* (2013.01); *H01L 23/3128* (2013.01); *H01L 23/3675* (2013.01); *H01L 23/5383* (2013.01); *H01L 23/5386* (2013.01); *H01L 24/16* (2013.01); *H01L 2224/16227* (2013.01); *H01L 2924/3512* (2013.01)

(56) References Cited

U.S. PATENT DOCUMENTS

| | | | |
|---|---|---|---|
| 8,004,096 B2 | 8/2011 | Fukuzono | |
| 8,410,613 B2* | 4/2013 | Watanabe | H01L 23/53228 |
| | | | 257/E23.18 |
| 8,946,900 B2 | 2/2015 | Qian et al. | |
| 9,287,194 B2 | 3/2016 | Hung | |
| 9,595,496 B2 | 3/2017 | Lee et al. | |
| 10,573,579 B2 | 2/2020 | Chen et al. | |
| 10,593,630 B2 | 3/2020 | Fang et al. | |
| 10,840,215 B2 | 11/2020 | Lu et al. | |
| 2008/0079163 A1* | 4/2008 | Kurita | H01L 25/0657 |
| | | | 257/E23.141 |
| 2011/0156235 A1 | 6/2011 | Yuan | |
| 2013/0043581 A1 | 2/2013 | Negoro | |
| 2013/0187258 A1 | 7/2013 | Lu et al. | |
| 2014/0048326 A1 | 2/2014 | Lin et al. | |
| 2014/0131877 A1* | 5/2014 | Chen | H01L 23/562 |
| | | | 257/769 |
| 2014/0264791 A1 | 9/2014 | Manusharow et al. | |
| 2014/0299999 A1 | 10/2014 | Hu et al. | |
| 2015/0001717 A1* | 1/2015 | Karhade | H01L 24/17 |
| | | | 257/741 |
| 2015/0007944 A1 | 1/2015 | Menno | |
| 2015/0041969 A1 | 2/2015 | Chang et al. | |
| 2015/0077944 A1 | 3/2015 | Li et al. | |
| 2015/0357255 A1 | 12/2015 | Lin et al. | |
| 2016/0190073 A1 | 6/2016 | Chen | |
| 2017/0084596 A1 | 3/2017 | Scanlan | |
| 2017/0117200 A1* | 4/2017 | Kim | H01L 24/97 |
| 2018/0102338 A1 | 4/2018 | Mclellan | |
| 2018/0204827 A1 | 7/2018 | Betsui et al. | |
| 2019/0164861 A1 | 5/2019 | Tsai et al. | |
| 2020/0075546 A1 | 3/2020 | Shih et al. | |
| 2020/0243448 A1* | 7/2020 | Qian | H01L 21/4853 |

OTHER PUBLICATIONS

Final Office Action for U.S. Appl. No. 16/656,331, issued Jan. 13, 2023, 20 pages.
Non-Final Office Action for U.S. Appl. No. 16/656,331, issued Jun. 30, 2021, 18 pages.
Non-Final Office Action on for U.S. Appl. No. 16/656,331, issued Jul. 8, 2022, 18 pages.
Notice of Allowance for U.S. Appl. No. 16/656,331, issued Mar. 24, 2023, 11 pages.

* cited by examiner

PACKAGE STRUCTURE, ASSEMBLY STRUCTURE AND METHOD FOR MANUFACTURING THE SAME

CROSS-REFERENCE TO RELATED APPLICATION

This application is a continuation of U.S. patent application Ser. No. 16/656,331, filed Oct. 17, 2019, the contents of which is incorporated herein by reference in its entirety.

BACKGROUND

1. Field of the Disclosure

The present disclosure relates to a package structure, an assembly structure, and a manufacturing method, and to a package structure including a reinforcement structure, an assembly structure including the same, and a method for manufacturing the same.

2. Description of the Related Art

In a semiconductor assembly structure, a semiconductor package structure is mounted to a substrate, and a heat sink is attached to a top surface of the semiconductor package structure so as to dissipate the heat generated from the semiconductor device(s) in the semiconductor package during operation. However, when the heat sink is attached to the semiconductor package structure, a pressing force may be transmitted from the heat sink to the semiconductor package structure. Since a rigidity or stiffness of the semiconductor package structure is relatively low, a crack may be formed at the top surface of the semiconductor package structure and extend or grow into the interior of the semiconductor package structure. If the crack reaches the semiconductor package structure, the circuit portion in the semiconductor package structure may be damaged or broken, which may result in an open circuit and render the semiconductor package structure inoperative. Thus, a yield of the semiconductor assembly structure may decrease.

SUMMARY

In some embodiments, a package structure includes a wiring structure, a first electronic device, a second electronic device and a reinforcement structure. The wiring structure includes at least one dielectric layer, and at least one circuit layer in contact with the dielectric layer. The at least one circuit layer includes at least one interconnection portion. The first electronic device and the second electronic device are electrically connected to the wiring structure. The second electronic device is electrically connected to the first electronic device through the at least one interconnection portion of the at least one circuit layer. The reinforcement structure is disposed above the at least one interconnection portion of the at least one circuit layer.

In some embodiments, an assembly structure includes a base substrate, a package structure and a heat sink. The package structure is electrically connected to the base substrate, and includes a wiring structure, a first electronic device, a second electronic device and a reinforcement structure. The wiring structure includes at least one dielectric layer and at least one circuit layer in contact with the dielectric layer. The first electronic device and the second electronic device are electrically connected to the first electronic device through the wiring structure. The reinforcement structure is disposed on the wiring structure and between the first electronic device and the second electronic device. The heat sink is attached to the package structure.

In some embodiments, a manufacturing method includes: (a) providing a wiring structure with a reinforcement structure, wherein the wiring structure includes at least one dielectric layer and at least one circuit layer in contact with the dielectric layer, the at least one circuit layer includes at least one interconnection portion, and the reinforcement structure is disposed above the at least one interconnection portion of the at least one circuit layer; and (b) electrically connecting a first electronic device and a second electronic device to the wiring structure, wherein the second electronic device is electrically connected to the first electronic device through the at least one interconnection portion of the at least one circuit layer.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
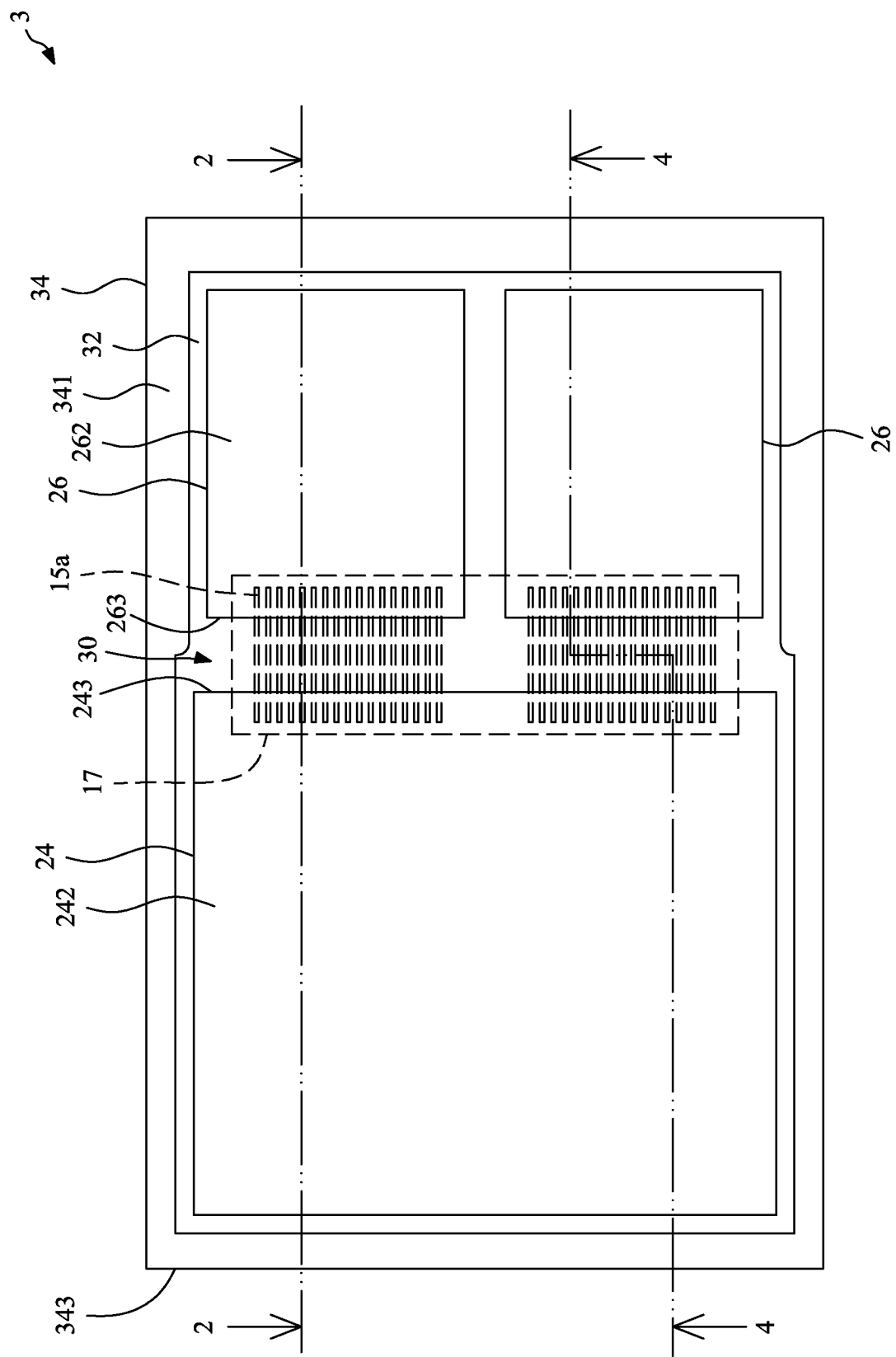
FIG. 1 illustrates a top view of a package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

At least some embodiments of the present disclosure provide for a package structure which has an improved crack resistance. In some embodiments, an assembly structure includes such package structure so as to improve a reliability or a yield thereof. At least some embodiments of the present disclosure further provide for techniques for manufacturing the package structure and the assembly structure.

Figure 2:
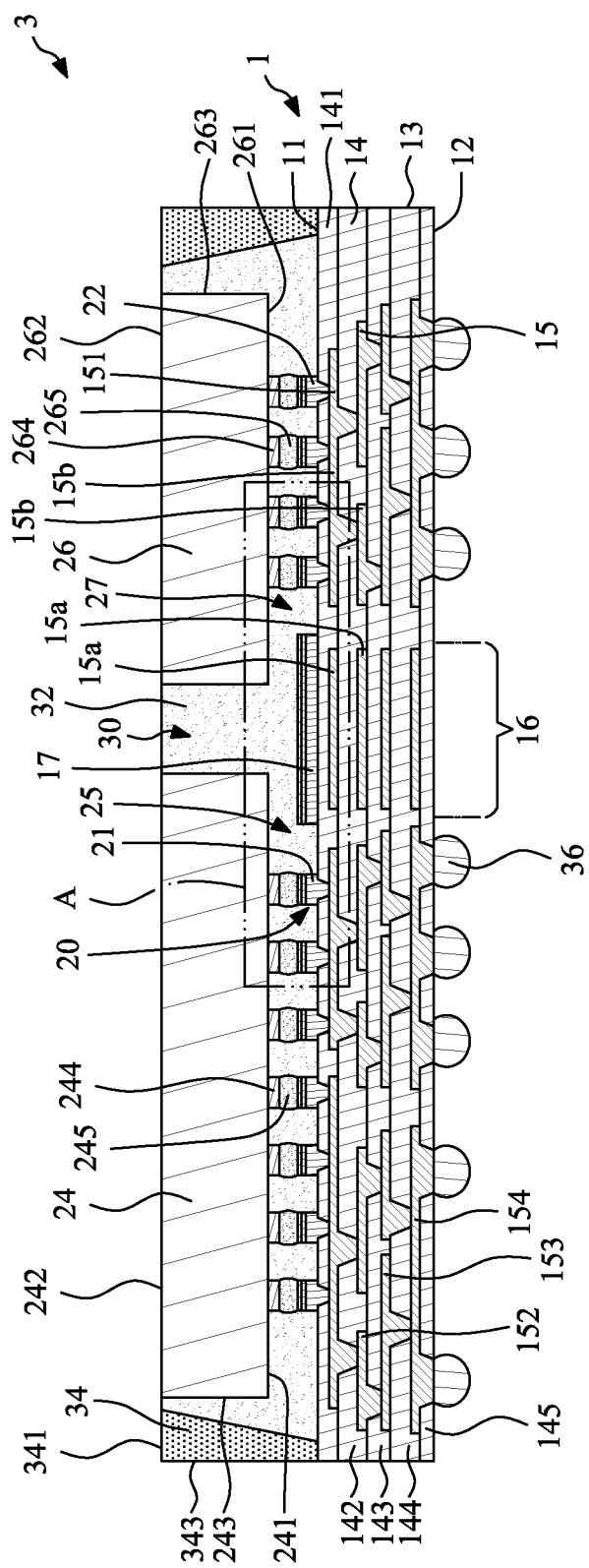
FIG. 2 illustrates a cross-sectional view taken along line 2-2 of the package structure of FIG. 1.
Figure 3:
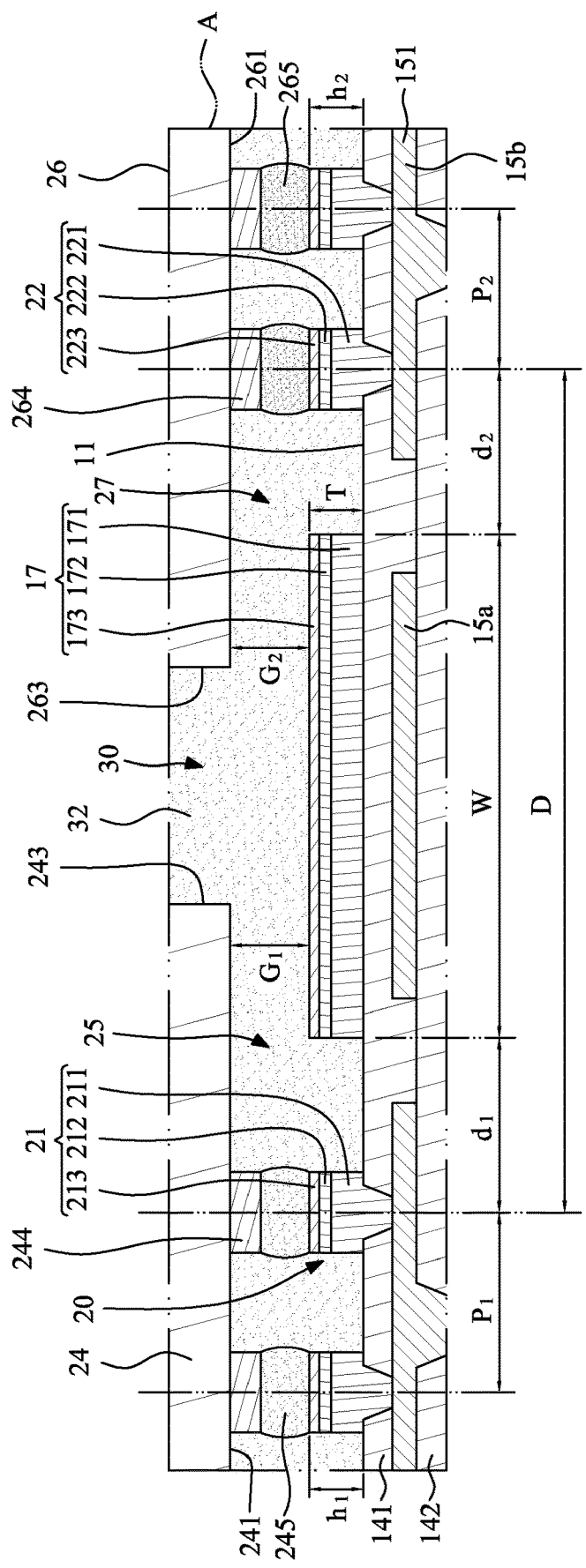
FIG. 3 illustrates an enlarged view of a region "A" in FIG. 2.
Figure 4:
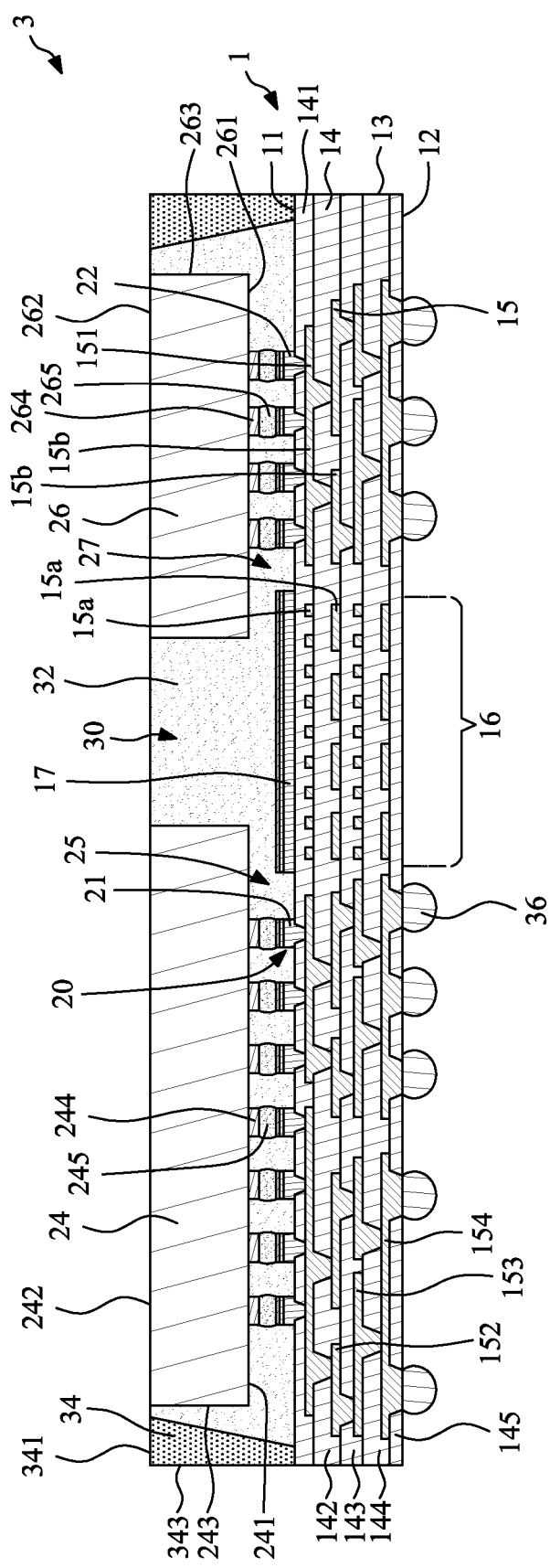
FIG. 4 illustrates a cross-sectional view taken along line 4-4 of the package structure of FIG. 1.

FIG. 1 illustrates a top view of a package structure 3 according to some embodiments of the present disclosure. FIG. 2 illustrates a cross-sectional view taken along line 2-2 of the package structure 3 of FIG. 1. FIG. 3 illustrates an enlarged view of a region "A" in FIG. 2. FIG. 4 illustrates a cross-sectional view taken along line 4-4 of the package structure 3 of FIG. 1. The package structure 3 includes a wiring structure 1, a first electronic device 24, a second electronic device 26, a reinforcement structure 17, a first protection material 32, an encapsulant 34 and a plurality of solder materials 36. As shown in FIG. 1, the package structure 3 may include one first electronic device 24 and two second electronic devices 26. However, the amounts of the first electronic device(s) 24 and the second electronic device(s) 26 are not limited in the present disclosure.

As shown in FIG. 2 and FIG. 4, the wiring structure 1 has a first surface 11, a second surface 12 opposite to the first surface 11, a lateral surface 13 extending between the first surface 11 and the second surface 12, and a high density region 16 (or a fine line region) between the first electronic device 24 and the second electronic device 26. The wiring structure 1 may include at least one dielectric layer 14, at least one circuit layer 15 in contact with the dielectric layer 14, and a plurality of protrusion pads 20. For example, as shown in FIG. 2 and FIG. 4, the wiring structure 1 includes a first dielectric layer 141, a first circuit layer 151, a second dielectric layer 142, a second circuit layer 152, a third dielectric layer 143, a third circuit layer 153, a fourth dielectric layer 144, a fourth circuit layer 154, and a fifth dielectric layer 145. That is, the at least one dielectric layer 14 includes the first dielectric layer 141, the second dielectric layer 142, the third dielectric layer 143, the fourth dielectric layer 144 and the fifth dielectric layer 145. The at least one circuit layer 15 includes the first circuit layer 151, the second circuit layer 152, the third circuit layer 153 and the fourth circuit layer 154.

The first dielectric layer 141 may be a topmost dielectric layer or an outermost dielectric layer of the wiring structure 1. The first circuit layer 151 may be a topmost circuit layer or an outermost circuit layer of the wiring structure 1. A material of the first circuit layer 151 may include, for example, copper, another conductive metal, or an alloy thereof. A material of the first dielectric layer 141 may include an insulating material, a passivation material, a dielectric material or a solder resist material, such as, for example, a benzocyclobutene (BCB) based polymer or a polyimide (PI). In some embodiments, the first dielectric layer 141 may be made of a photoimageable material. In addition, the first surface 11 of the wiring structure 1 may be a top surface of the first dielectric layer 141. The first circuit layer 151 is disposed adjacent to the top surface of the first dielectric layer 141. In some embodiments, the first circuit layer 151 is embedded in the first dielectric layer 141, and is exposed from the top surface of the first dielectric layer 141. That is, the first dielectric layer 141 covers the first circuit layer 151, and defines a plurality of openings to expose portions of the first circuit layer 151.

Further, the first circuit layer 151 may include an interconnection portion 15a and a periphery portion 15b. The interconnection portion 15a is located in the high density region 16, and the periphery portion 15b is located outside the high density region 16 (e.g., a low density region). For example, the second electronic device 26 may be electrically connected to the first electronic device 24 through the interconnection portion 15a of the first circuit layer 151. The second electronic device 26 and the first electronic device 24 may be electrically connected to the solder materials 36 on the second surface 12 of the wiring structure 1 through the periphery portion 15b of the first circuit layer 151. A line width/line space (L/S) of the traces of the interconnection portion 15a may be less than an L/S of the traces of the periphery portion 15b. For example, an L/S of the traces of the interconnection portion 15a may be less than or equal to about 5 µm/about 5 µm, or less than or equal to about 2 µm/about 2 µm, or less than or equal to about 0.8 µm/about 0.8 µm. An L/S of the traces of the periphery portion 15b may be less than or equal to about 10 µm/about 10 µm, or less than or equal to about 7 µm/about 7 µm, or less than or equal to about 5 µm/about 5 µm.

The first dielectric layer 141 and the first circuit layer 151 may be disposed on the second dielectric layer 142. In addition, the second dielectric layer 142 may cover the second circuit layer 152. A portion (e.g., a via portion) of the first circuit layer 151 extends through the second dielectric layer 142 to electrically connect the second circuit layer 152. A material of the second dielectric layer 142 may be the same as or similar to the material of the first dielectric layer 141. The second circuit layer 152 may also include an interconnection portion 15a located in the high density region 16, and a periphery portion 15b located outside the high density region 16. In some embodiments, the via portion of the first circuit layer 151 may extend from the periphery portion 15b, and they may be formed concurrently and integrally.

Similarly, the second dielectric layer 142 and the second circuit layer 152 may be disposed on the third dielectric layer 143. In addition, the third dielectric layer 143 may cover the third circuit layer 153. A portion (e.g., a via portion) of the second circuit layer 152 extends through the third dielectric layer 143 to electrically connect the third circuit layer 153. A material of the third dielectric layer 143 may be the same as or similar to the material of the second dielectric layer 142. The third circuit layer 153 may also include an interconnection portion 15a located in the high density region 16, and a periphery portion 15b located outside the high density region 16. In some embodiments, the via portion of the second circuit layer 152 may extend from the periphery portion 15b, and they may be formed concurrently and integrally.

Similarly, the third dielectric layer 143 and the third circuit layer 153 may be disposed on the fourth dielectric layer 144. In addition, the fourth dielectric layer 144 may cover the fourth circuit layer 154. A portion (e.g., a via portion) of the third circuit layer 153 extends through the fourth dielectric layer 144 to electrically connect the fourth circuit layer 154. A material of the fourth dielectric layer 144 may be the same as or similar to the material of the third dielectric layer 143. The fourth circuit layer 154 may also include an interconnection portion 15a located in the high density region 16, and a periphery portion 15b located outside the high density region 16.

The fourth dielectric layer 144 and the fourth circuit layer 154 may be disposed on the fifth dielectric layer 145. A portion (e.g., a via portion) of the fourth circuit layer 154 extends through the fifth dielectric layer 145 to be exposed from a bottom surface of the fifth dielectric layer 145 (e.g., the second surface 12 of the wiring structure 1). A material of the fifth dielectric layer 145 may be the same as or similar to the material of the fourth dielectric layer 144. As shown in FIG. 2 and FIG. 4, the second electronic device 26 may be electrically connected to the first electronic device 24 through the interconnection portion 15a of the circuit layer 15 (including, for example, the interconnection portions 15a of the first circuit layer 151, the second circuit layer 152, the third circuit layer 153 and the fourth circuit layer 154). The second electronic device 26 and the first electronic device 24 may be electrically connected to the solder materials 36 through the via portions of the periphery portion 15b of the circuit layer 15 (including, for example, the periphery portions 15b of the first circuit layer 151, the second circuit layer 152, the third circuit layer 153 and the fourth circuit layer 154).

The protrusion pads 20 may be disposed on and protrude from the first dielectric layer 141 (e.g., the topmost dielectric layer or the outermost dielectric layer) of the wiring structure 1. The protrusion pads 20 may be disposed on and protrude from the first surface 11 of the wiring structure 1, and extend through the first dielectric layer 141 (e.g., the topmost dielectric layer or the outermost dielectric layer) to electrically connect the first circuit layer 151. The protrusion pads 20 may include a plurality of first protrusion pads 21 corresponding to the first electronic device 24 and a plurality of second protrusion pads 22 corresponding to the second electronic device 26.

The first electronic device 24 and the second electronic device 26 are disposed adjacent to the first surface 11 of the wiring structure 1 side by side, and are electrically connected to the circuit layer 15 of the wiring structure 1. The first electronic device 24 may be a semiconductor device such as an application specific integrated circuit (ASIC) die. As shown in FIG. 2 and FIG. 4, the first electronic device 24 may have a first active surface 241, a first backside surface 242 opposite to the first active surface 241, and a lateral surface 243 extending between the first active surface 241 and the first backside surface 242. Further, the first electronic device 24 may include a plurality of first electrical contacts 244 disposed adjacent to the first active surface 241. The first electrical contacts 244 may be exposed or may protrude from the first active surface 241 for electrical connection. The first electrical contacts 244 may be pads, bumps, studs, pillars or posts. In some embodiments, the first electrical contacts 244 of the first electronic device 24 may be electrically connected and physically connected to the first protrusion pads 21 through a plurality of solder materials 245. In other words, the first electronic device 24 may be electrically connected to the wiring structure 1 by flip-chip bonding. For example, the first electrical contacts 244 may include copper, gold, platinum, and/or other suitable material.

The second electronic device 26 may be a semiconductor device such as high bandwidth memory (HBM) die. As shown in FIG. 2 and FIG. 4, the second electronic device 26 may have a second active surface 261, a second backside surface 262 opposite to the second active surface 261, and a lateral surface 263 extending between the second active surface 261 and the second backside surface 262. Further, the second electronic device 26 may include a plurality of second electrical contacts 264 disposed adjacent to the second active surface 261. The second electrical contacts 264 may be exposed or may protrude from the second active surface 261 for electrical connection. The second electrical contacts 264 may be pads, bumps, studs, pillars or posts. In some embodiments, the second electrical contacts 264 of the second electronic device 26 may be electrically connected and physically connected to the second protrusion pads 22 through a plurality of solder materials 265. In other words, the second electronic device 26 may be electrically connected to the wiring structure 1 by flip-chip bonding. For example, the second electrical contact 264 may include copper, gold, platinum, and/or other suitable material.

The reinforcement structure 17 is disposed above the interconnection portion 15a of the circuit layer 15 so as to protect the interconnection portion 15a of the circuit layer 15. As shown in FIG. 2 and FIG. 4, the reinforcement structure 17 may be disposed on the first surface 11 of the wiring structure 1 (e.g., the top surface of the first dielectric layer 141 (e.g., the topmost dielectric layer or the outermost dielectric layer)). Further, the reinforcement structure 17 is disposed on the high density region 16 between the first electronic device 24 and the second electronic device 26. Thus, the reinforcement structure 17 may extend into a first space 25 between the first electronic device 24 and the wiring structure 1 and/or a second space 27 between the second electronic device 26 and the wiring structure 1. In some embodiments, a Young's modulus of the reinforcement structure 17 may be 80 GPa to 200 GPa. The reinforcement structure 17 may be dummy. That is, the reinforcement structure 17 may have no electrical function. A material of the reinforcement structure 17 may include metal, polymer, or other suitable material.

The first protection material 32 (e.g., an underfill) is disposed in the first space 25 between the first electronic device 24 and the wiring structure 1 and the second space 27 between the second electronic device 26 and the wiring structure 1 so as to cover and protect the reinforcement structure 17, the joints formed by the first electrical contacts 244, the first protrusion pads 21 and the solder materials 245, and the joints formed by the second electrical contacts 264, the second protrusion pads 22 and the solder materials 265. In addition, the first protection material 32 may further extend into a gap 30 between the lateral surface 243 of the first electronic device 24 and the lateral surface 263 of the second electronic device 26.

The encapsulant 34 covers at least a portion of the first surface 11 of the wiring structure 1, at least a portion of the first electronic device 24, at least a portion of the second electronic device 26 and the first protection material 32. A material of the encapsulant 34 may be a molding compound with or without fillers. The encapsulant 34 has a first surface 341 (e.g., a top surface) and a lateral surface 343. As shown in FIG. 2 and FIG. 4, the first surface 341 of the encapsulant 34, the first backside surface 242 of the first electronic device 24, the second backside surface 262 of the second electronic device 26 and a top surface of the first protection material 32 in the gap 30 may be substantially coplanar with each other. However, in other embodiments, the top surface of the first protection material 32 in the gap 30 may be recessed from the first backside surface 242 of the first electronic device 24 and/or the second backside surface 262 of the second electronic device 26. Thus, a portion of the encapsulant 34 may extend into the gap 30 between the first electronic device 24 and the second electronic device 26. In addition, the lateral surface 343 of the encapsulant 34 may be substantially coplanar with the lateral surface 13 of the wiring structure 1.

The solder materials 36 (e.g., solder balls) are disposed adjacent to the second surface 12 of the wiring structure 1 for external connection. As shown in FIG. 2 and FIG. 4, the solder materials 36 are disposed on the exposed portions (e.g., the bottom portions of the via portions) of the fourth circuit layer 154.

As shown in FIG. 3, a material of the protrusion pads 20 (including the first protrusion pads 21 and the second protrusion pads 22) may be the same as a material of the reinforcement structure 17, and a thickness T of the reinforcement structure 17 may be substantially equal to a height of the protrusion pad 20 (including a height h1 of the first protrusion pad 21 and a height h2 of the second protrusion pad 22), since they may be formed concurrently in a same process stage. However, in other embodiments, the material of the protrusion pads 20 may be different from the material of the reinforcement structure 17, and the thickness T of the reinforcement structure 17 may be different from the height of the protrusion pad 20 (including the height h1 of the first protrusion pad 21 and the height h2 of the second protrusion pad 22), since they may be formed non-concurrently in different process stages.

In some embodiments, the first protrusion pad 21 may include a first metal layer 211, a second metal layer 212 and a third metal layer 213 sequentially disposed on the first surface 11 of the wiring structure 1 (e.g., the top surface of the first dielectric layer 141 (e.g., the topmost dielectric layer or the outermost dielectric layer)). The first metal layer 211 may extend through the first dielectric layer 141 to contact the first circuit layer 151. For example, the first metal layer 211 may include copper, the second metal layer 212 may include nickel, and the third metal layer 213 may include gold. Similarly, the second protrusion pad 22 may include a first metal layer 221, a second metal layer 222 and a third metal layer 223 sequentially disposed on the first surface 11 of the wiring structure 1 (e.g., the top surface of the first dielectric layer 141 (e.g., the topmost dielectric layer or the outermost dielectric layer)). The first metal layer 221 may extend through the first dielectric layer 141 to contact the first circuit layer 151. For example, the first metal layer 221 may include copper, the second metal layer 222 may include nickel, and the third metal layer 223 may include gold. In addition, the reinforcement structure 17 may include a first metal layer 171, a second metal layer 172 and a third metal layer 173 sequentially disposed on the first surface 11 of the wiring structure 1 (e.g., the top surface of the first dielectric layer 141 (e.g., the topmost dielectric layer or the outermost dielectric layer)). For example, the first metal layer 171 may include copper, the second metal layer 172 may include nickel, and the third metal layer 173 may include gold.

A width of the reinforcement structure 17 is defined as "W", a first distance between the centers of the first protrusion pads 21 is defined as "$P_1$", a second distance between the centers of the second protrusion pads 22 is defined as "$P_2$", a left distance between a left lateral surface of the reinforcement structure 17 and a center of the first protrusion pad 21 nearest to the reinforcement structure 17 is defined as "$d_1$", a right distance between a right lateral surface of the reinforcement structure 17 and a center of the second protrusion pad 22 nearest to the reinforcement structure 17 is defined as "$d_2$", and a distance between the nearest pair of first protrusion pad 21 and second protrusion pad 22 is defined as "D". Thus, "W" is equal to [D−($d_1$+$d_2$)]. In some embodiments, "$d_1$" is greater than or equal to "$P_1$", and "$d_2$" is greater than or equal to "$P_2$" so as to prevent a short circuit between the reinforcement structure 17 and the protrusion pads 20 (including the first protrusion pads 21 and the second protrusion pads 22). Thus, "W" is less than or equal to [D−($P_1$+$P_2$)]. That is, a maximum value of "W" is equal to [D−($P_1$+$P_2$)]. In addition, a minimum value of "W" is equal to 30 μm. That is, the width W of the reinforcement structure 17 is greater than or equal to 30 μm. In some embodiments, the width W of the reinforcement structure 17 is greater than the gap 30 between the first electronic device 24 and the second electronic device 26. In some embodiments, the width W of the reinforcement structure 17 is in a range of 210 µm~350 µm.

A gap $G_1$ may be formed between the first electronic device 24 and the reinforcement structure 17, and a gap $G_2$ may be formed between the second electronic device 26 and the reinforcement structure 17. In some embodiments, the gap $G_1$ may be formed between the active surface 241 of the first electronic device 24 and the top surface of the reinforcement structure 17, and the gap $G_2$ may be formed between the active surface 261 of the second electronic device 26 and the top surface of the reinforcement structure 17. The gap $G_1$ may allow the first protection material 32 to flow into the gap 30 from the first space 25, or flow into the first space 25 from the gap 30. The gap $G_2$ may allow the first protection material 32 to flow into the gap 30 from the second space 27, or flow into the second space 27 from the gap 30. In other words, the reinforcement structure 17 may not contact the first electronic device 24 and the second electronic device 26.

In the embodiment illustrated in FIG. 1 to FIG. 4, the reinforcement structure 17 may increase the rigidity or stiffness of the wiring structure 1 and the package structure 3 so as to reduce a warpage of the wiring structure 1 and the package structure 3. Thus, the risk of formation of crack in the first protection material 32 or the encapsulant 34 is low. In addition, if a crack is formed at the top surface of the first protection material 32 in the gap 30 and extend or grow downward, it will be stopped by the reinforcement structure 17. Thus, the reinforcement structure 17 may prevent the crack from reaching the wiring structure 1, and may protect the interconnection portion 15a of the circuit layer 15 from being damaged or broken. Therefore, the reliability and yield of the package structure 3 is improved.

Figure 5:
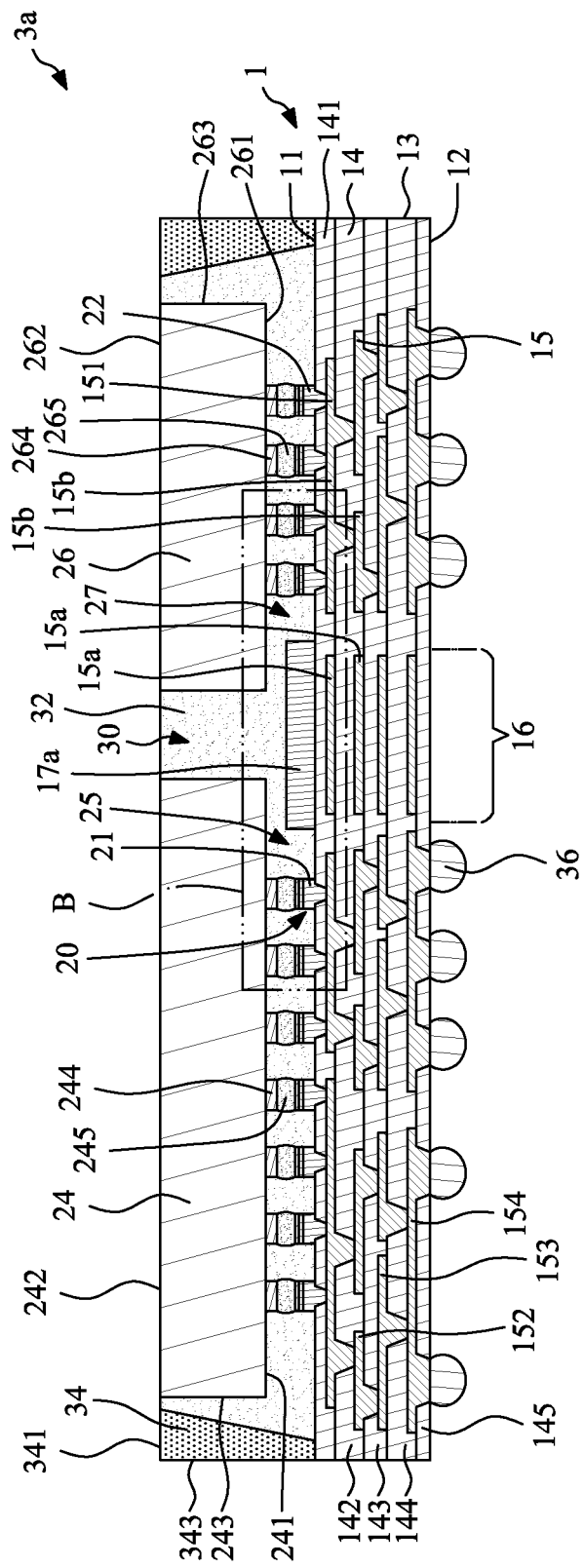
FIG. 5 illustrates a cross-sectional view of an example of a package structure according to some embodiments of the present disclosure.
Figure 6:
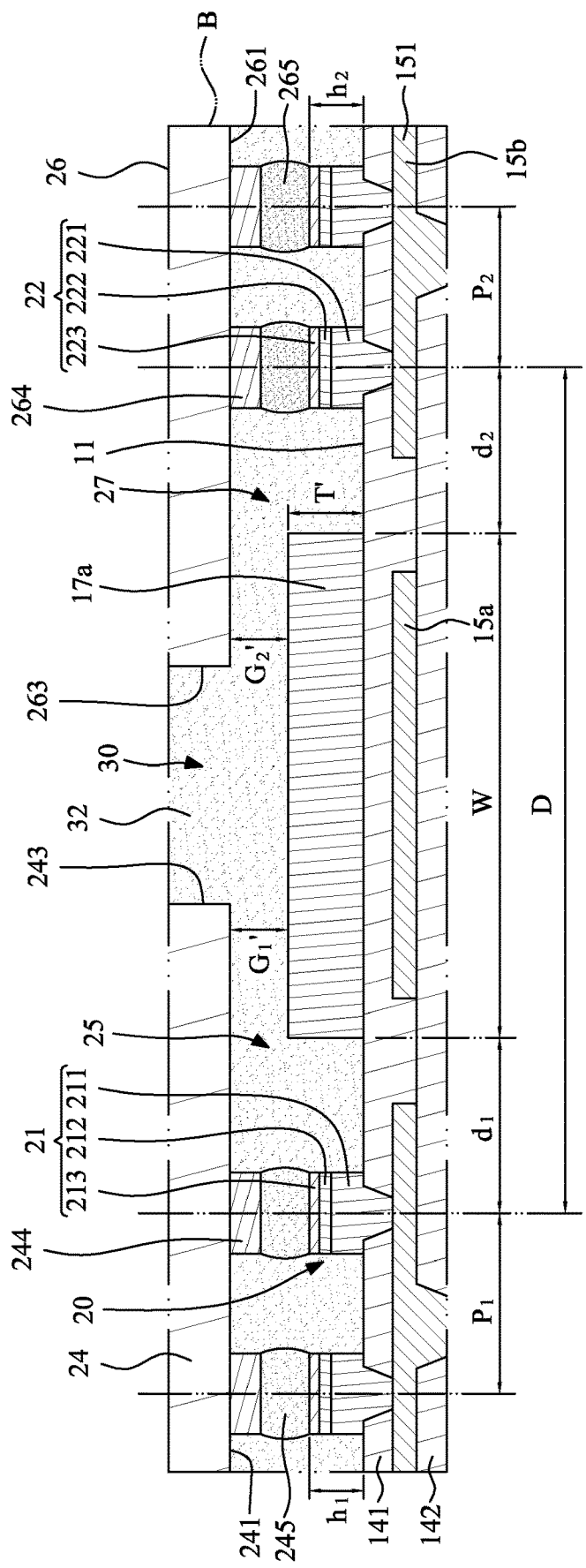
FIG. 6 illustrates an enlarged view of a region "B" in FIG. 5.

FIG. 5 illustrates a cross-sectional view of an example of a package structure 3a according to some embodiments of the present disclosure. FIG. 6 illustrates an enlarged view of a region "B" in FIG. 5. The package structure 3a of FIG. 5 and FIG. 6 is similar to the package structure 3 of FIG. 2 and FIG. 3, except for a structure of the reinforcement structure 17a. As shown in FIG. 5 and FIG. 6, the reinforcement structure 17a and the protrusion pads 20 (including the first protrusion pads 21 and the second protrusion pads 22) may not be formed concurrently. That is, the reinforcement structure 17a and the protrusion pads 20 may be formed non-concurrently. In some embodiments, the reinforcement structure 17a is formed after the formation of the protrusion pads 20 (including the first protrusion pads 21 and the second protrusion pads 22). Thus, a material of the protrusion pads 20 (including the first protrusion pads 21 and the second protrusion pads 22) may be different from a material of the reinforcement structure 17a, and a thickness T' of the reinforcement structure 17a may be different from a height of the protrusion pad 20 (including a height h1 of the first protrusion pad 21 and a height h2 of the second protrusion pad 22). That is, the reinforcement structure 17a may be a single layered metal layer, the thickness T' of the reinforcement structure 17a may be greater than or less than a height of the protrusion pad 20 (including a height h1 of the first protrusion pad 21 and a height h2 of the second protrusion pad 22). Therefore, the thickness T' of the reinforcement structure 17a may be controlled to a desired value or a predetermined value. Accordingly, the gap G1' between the first electronic device 24 and the reinforcement structure 17a and the gap G2' between the second electronic device 26 and the reinforcement structure 17a may be also controlled to a desired value or a predetermined value.

Figure 7:
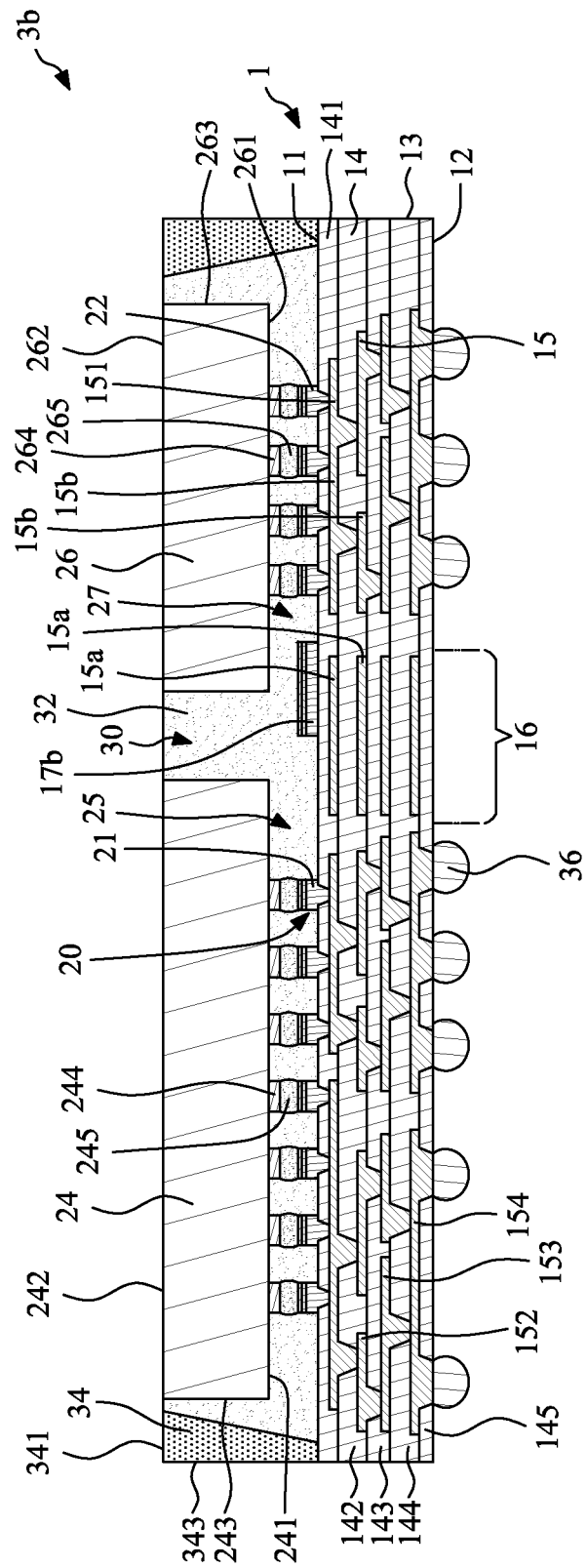
FIG. 7 illustrates a cross-sectional view of an example of a package structure according to some embodiments of the present disclosure.

FIG. 7 illustrates a cross-sectional view of an example of a package structure 3b according to some embodiments of the present disclosure. The package structure 3b of FIG. 7 is similar to the package structure 3 of FIG. 2, except for a structure of the reinforcement structure 17b. As shown in FIG. 7, the width of the reinforcement structure 17b may be reduced, and the position of the reinforcement structure 17b is close to the second electronic device 26.

Figure 8:
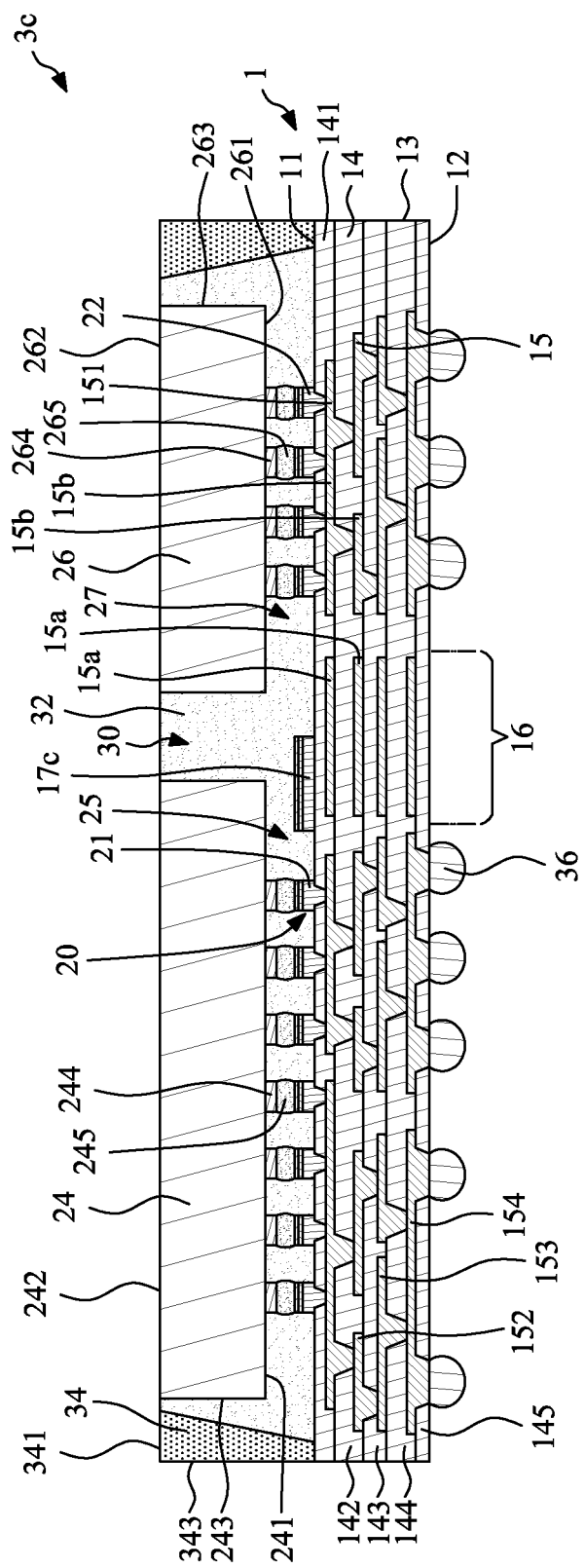
FIG. 8 illustrates a cross-sectional view of an example of a package structure according to some embodiments of the present disclosure.

FIG. 8 illustrates a cross-sectional view of an example of a package structure 3c according to some embodiments of the present disclosure. The package structure 3c of FIG. 8 is similar to the package structure 3 of FIG. 2, except for a structure of the reinforcement structure 17c. As shown in FIG. 8, the width of the reinforcement structure 17c may be reduced, and the position of the reinforcement structure 17c is close to the first electronic device 24.

Figure 9:
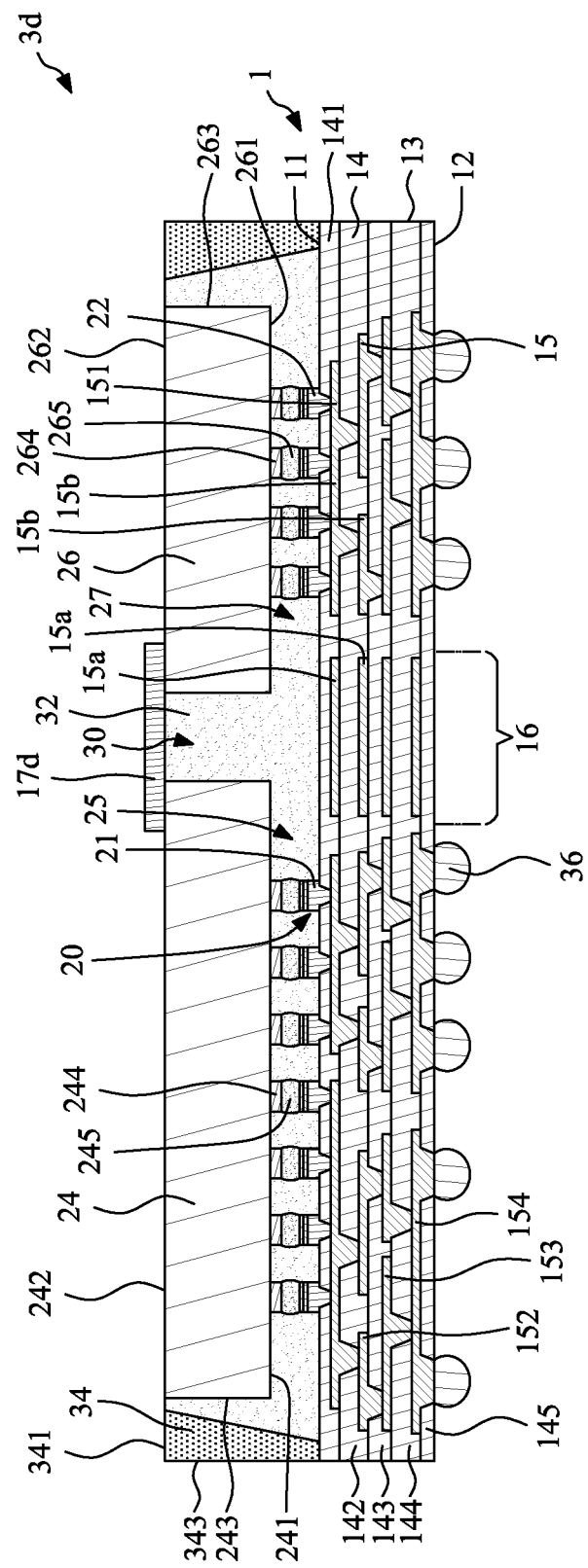
FIG. 9 illustrates a cross-sectional view of an example of a package structure according to some embodiments of the present disclosure.

FIG. 9 illustrates a cross-sectional view of an example of a package structure 3d according to some embodiments of the present disclosure. The package structure 3d of FIG. 9 is similar to the package structure 3 of FIG. 2, except for a structure and a position of the reinforcement structure 17d. As shown in FIG. 9, the reinforcement structure 17d may be a single layered metal layer, and may cover the gap 30 between the first electronic device 24 and the second electronic device 26. That is, the reinforcement structure 17d may contact or be attached to the first backside surface 242 of the first electronic device 24 and the second backside surface 262 of second first electronic device 26.

Figure 10:
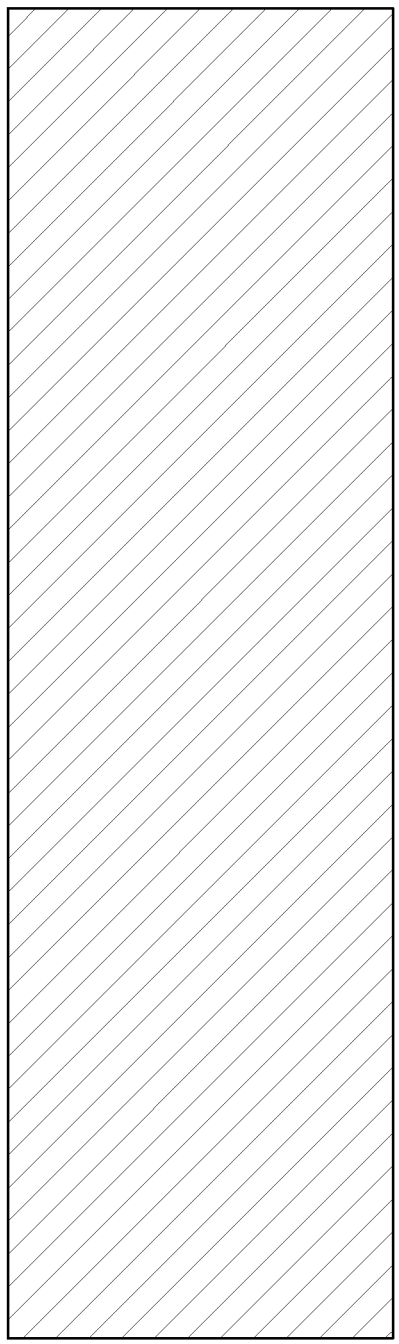
FIG. 10 illustrates a top view of an example of a reinforcement structure according to some embodiments of the present disclosure.

FIG. 10 illustrates a top view of an example of a reinforcement structure 17 according to some embodiments of the present disclosure. As shown in FIG. 10, the reinforcement structure 17 is a solid plate structure, and is a rectangular shape from a top view.

Figure 11:
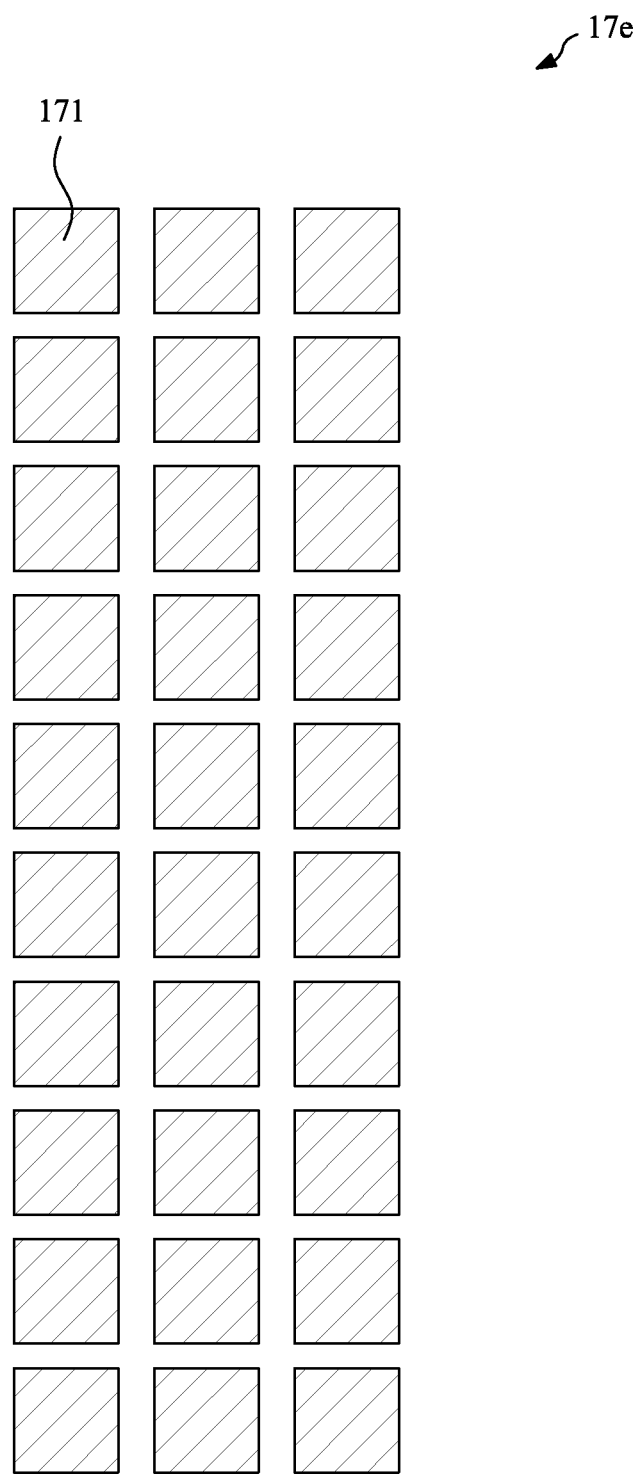
FIG. 11 illustrates a top view of an example of a reinforcement structure according to some embodiments of the present disclosure.

FIG. 11 illustrates a top view of an example of a reinforcement structure 17e according to some embodiments of the present disclosure. As shown in FIG. 11, the reinforcement structure 17e includes a pattern from a top view. The pattern includes a plurality of square blocks 171 spaced apart from each other and arranged in an array.

Figure 12:
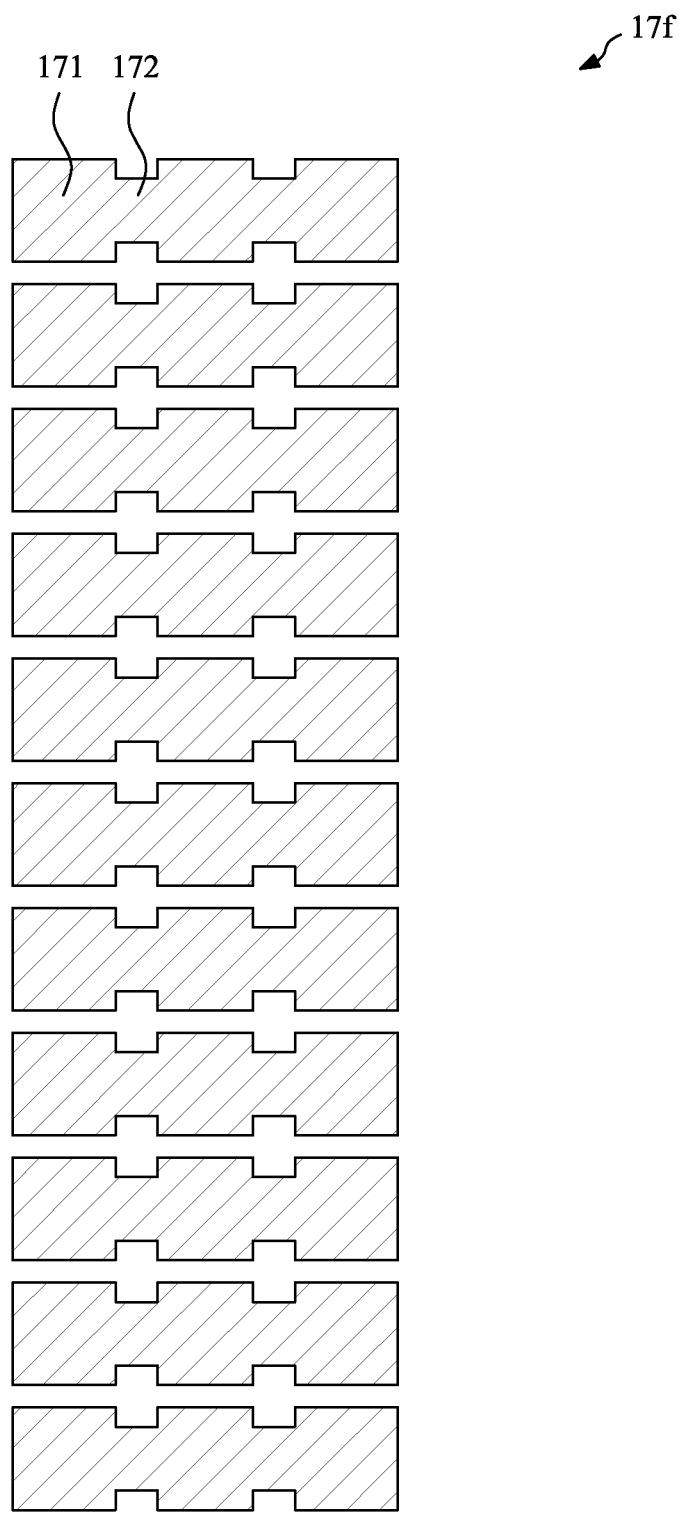
FIG. 12 illustrates a top view of an example of a reinforcement structure according to some embodiments of the present disclosure.

FIG. 12 illustrates a top view of an example of a reinforcement structure 17f according to some embodiments of the present disclosure. As shown in FIG. 12, the reinforcement structure 17f includes a pattern from a top view. The pattern includes a plurality of square blocks 171 and a plurality of first connecting bars 172. The square blocks 171 are spaced apart from each other and are arranged in an array. The first connecting bars 172 extend horizontally to connect the square blocks 171 in a row.

Figure 13:
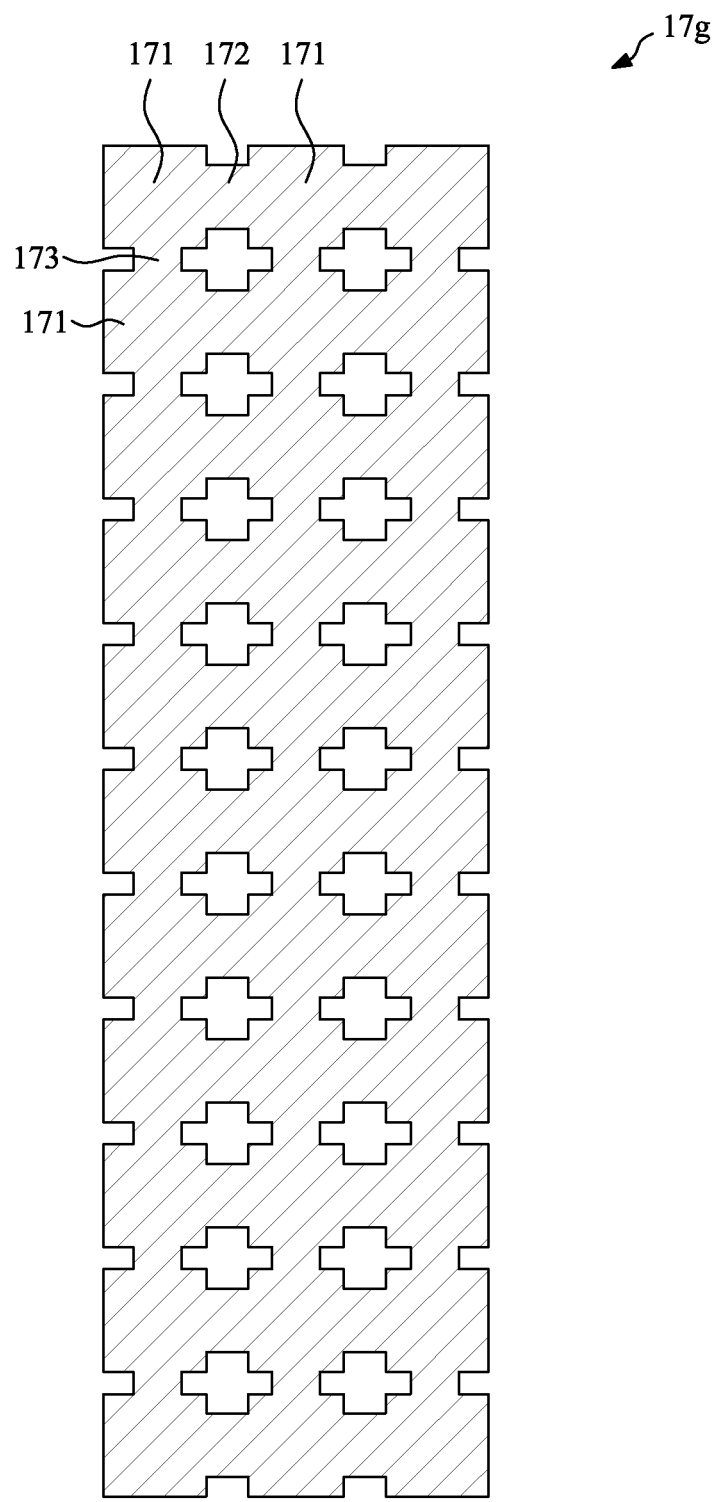
FIG. 13 illustrates a top view of an example of a reinforcement structure according to some embodiments of the present disclosure.

FIG. 13 illustrates a top view of an example of a reinforcement structure 17g according to some embodiments of the present disclosure. As shown in FIG. 13, the reinforcement structure 17g includes a pattern from a top view. The pattern includes a plurality of square blocks 171, a plurality of first connecting bars 172 and a plurality of second connecting bars 173. The square blocks 171 are spaced apart from each other and are arranged in an array. The first connecting bars 172 extend horizontally to connect the square blocks 171 in a row. The second connecting bars 173 extend vertically to connect the square blocks 171 in a column.

Figure 14:
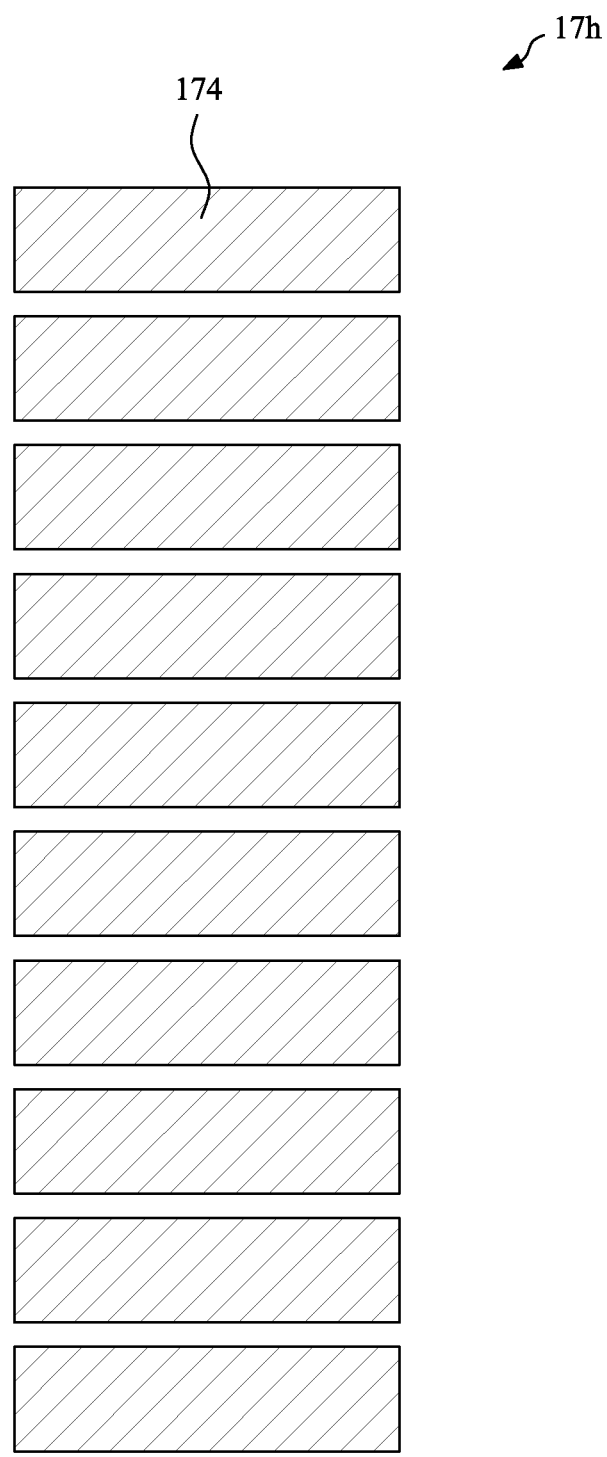
FIG. 14 illustrates a top view of an example of a reinforcement structure according to some embodiments of the present disclosure.

FIG. 14 illustrates a top view of an example of a reinforcement structure 17h according to some embodiments of the present disclosure. As shown in FIG. 14, the reinforcement structure 17h includes a pattern from a top view. The pattern includes a plurality of first strips 174. The first strips 174 are spaced apart from each other and extend horizontally.

Figure 15:
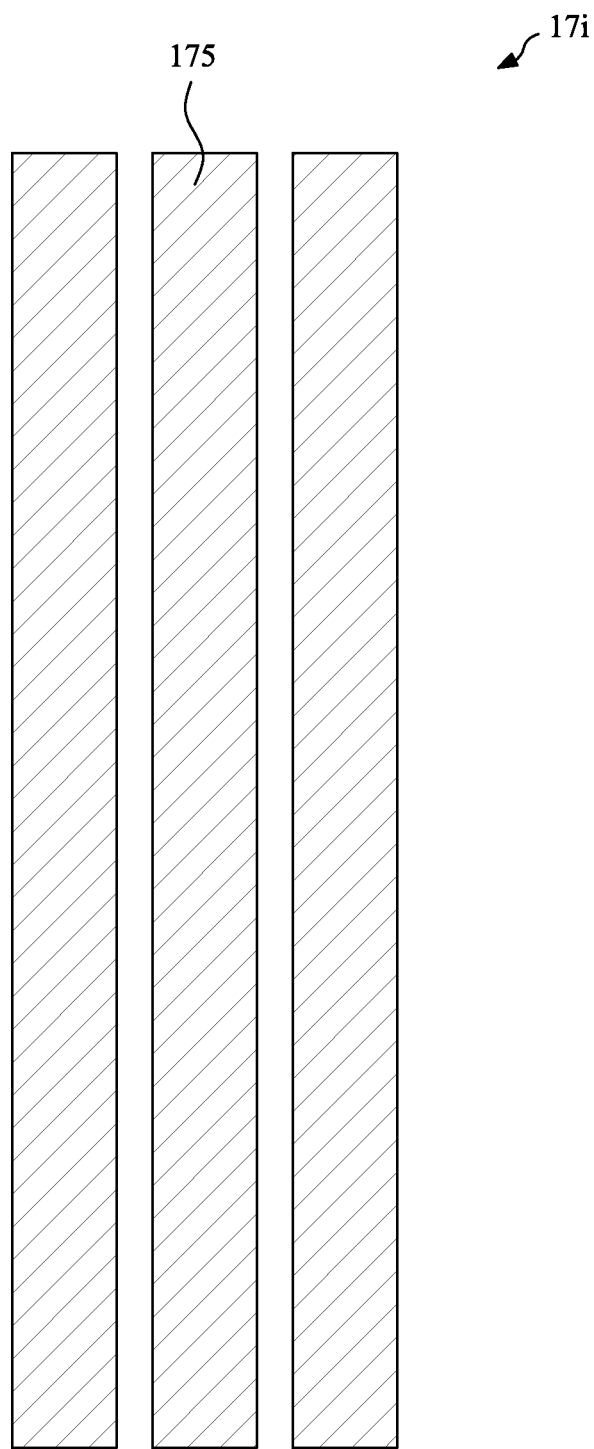
FIG. 15 illustrates a top view of an example of a reinforcement structure according to some embodiments of the present disclosure.

FIG. 15 illustrates a top view of an example of a reinforcement structure 17i according to some embodiments of the present disclosure. As shown in FIG. 15, the reinforcement structure 17i includes a pattern from a top view. The pattern includes a plurality of second strips 175. The second strips 175 are spaced apart from each other and extend vertically.

Figure 16:
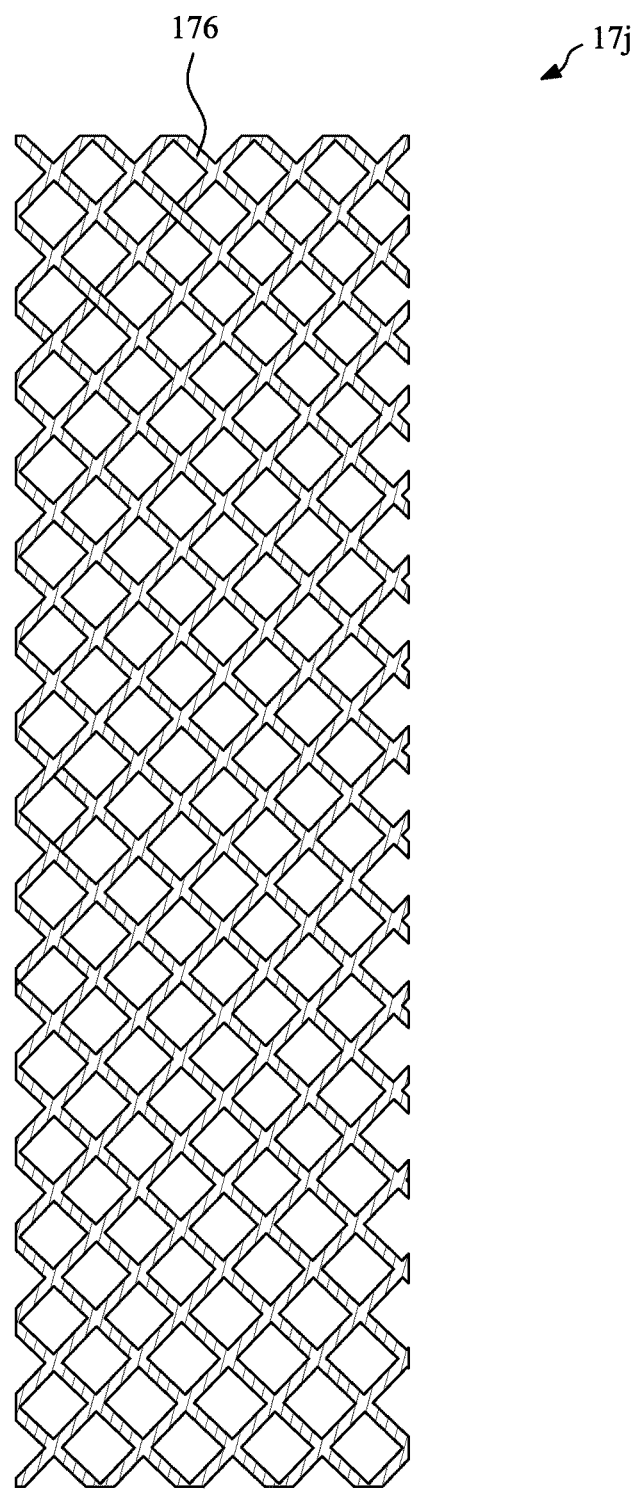
FIG. 16 illustrates a top view of an example of a reinforcement structure according to some embodiments of the present disclosure.

FIG. 16 illustrates a top view of an example of a reinforcement structure 17j according to some embodiments of the present disclosure. As shown in FIG. 16, the reinforcement structure 17j includes a pattern from a top view. The pattern includes a plurality of segments 176 cross with each other to form a net shape or a mesh shape.

Figure 17:
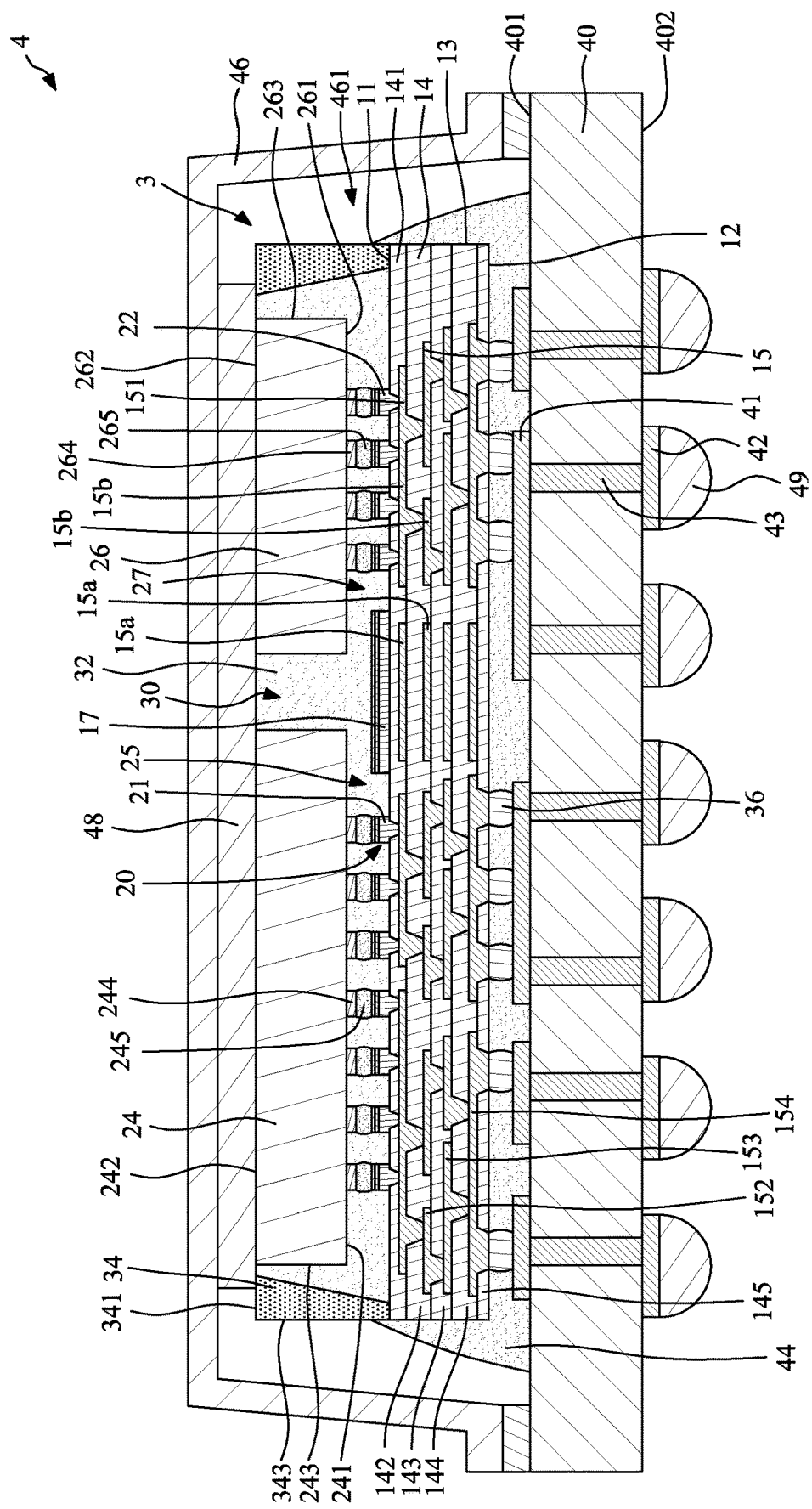
FIG. 17 illustrates a cross-sectional view of an assembly structure according to some embodiments of the present disclosure.

FIG. 17 illustrates a cross-sectional view of an assembly structure 4 according to some embodiments of the present disclosure. The assembly structure 4 may be a semiconductor package, and may include a base substrate 40, a package structure 3, a second protection material 44, a heat sink 46 and a plurality of external connectors 49.

The base substrate 40 may include a glass reinforced epoxy material (such as FR4), bismaleimide triazine (BT), epoxy resin, silicon, printed circuit board (PCB) material, glass, ceramic or photoimageable dielectric (PID) material. The base substrate 40 may have a first surface 401 and a second surface 402 opposite to the first surface 401. As shown in FIG. 17, the base substrate 40 may include a first circuit layer 41, a second circuit layer 42, and a plurality of conductive vias 43. The first circuit layer 41 may be disposed adjacent to the first surface 401 of the base substrate 40, and the second circuit layer 42 may be disposed adjacent to the second surface 402 of the base substrate 40. The conductive vias 43 may extend through the base substrate 40 and electrically connect the first circuit layer 41 and the second circuit layer 42.

The package structure 3 of FIG. 17 may be same as or similar to the package structure 3 of FIG. 1 to FIG. 4. The package structure 3 may be electrically connected to the first circuit layer 41 of the base substrate 40 through the solder materials 36. The second protection material 44 (e.g., an underfill) is disposed in a space between the package structure 3 and the base substrate 40 so as to cover and protect the solder materials 36 and the first circuit layer 41.

The heat sink 46 may be a cap or hat structure, and may define a cavity 461 for accommodating the package structure 3. A material of the heat sink 46 may include metal such as copper, aluminum, and/or other suitable material. A portion of the heat sink 46 may be attached to the top surface of the package structure 3 through a thermal material 48 (e.g., thermal interface material (TIM)) so as to dissipate the heat generated by the first electronic device 24 and the second electronic device 26. Another portion (e.g., bottom portion) of the heat sink 46 may be attached to the base substrate 40 through an adhesive material. In addition, the external connectors 49 (e.g., solder balls) are formed or disposed on the second circuit layer 42 for external connection. It is noted that the package structure 3 may be replaced by the package structures 3a, 3b, 3c, 3d of FIGS. 5, 7, 8, 9.

During a manufacturing process, when the heat sink 46 is attached to the package structure 3, a pressing force may be transmitted from the heat sink 46 to the package structure 3. Since, the reinforcement structure 17 may increase the rigidity or stiffness of the wiring structure 1 and the package structure 3, a warpage of the wiring structure 1 and the package structure 3 may be reduced. Thus, the risk of formation of crack in the first protection material 32 or the encapsulant 34 is low. However, if a crack is formed at the top surface of the first protection material 32 in the gap 30 and extend or grow downward, it will be stopped by the reinforcement structure 17. Thus, the reinforcement structure 17 may prevent the crack from reaching the wiring structure 1, and may protect the interconnection portion 15a of the circuit layer 15 from being damaged or broken. Therefore, the reliability and yield of the assembly structure 4 is improved.

FIG. 18 through FIG. 26 illustrate a method for manufacturing an assembly structure according to some embodiments of the present disclosure. In some embodiments, the method is for manufacturing the package structure 3 shown in FIG. 1 to FIG. 4, and the assembly structure 4 of FIG. 17.

Figure 18:
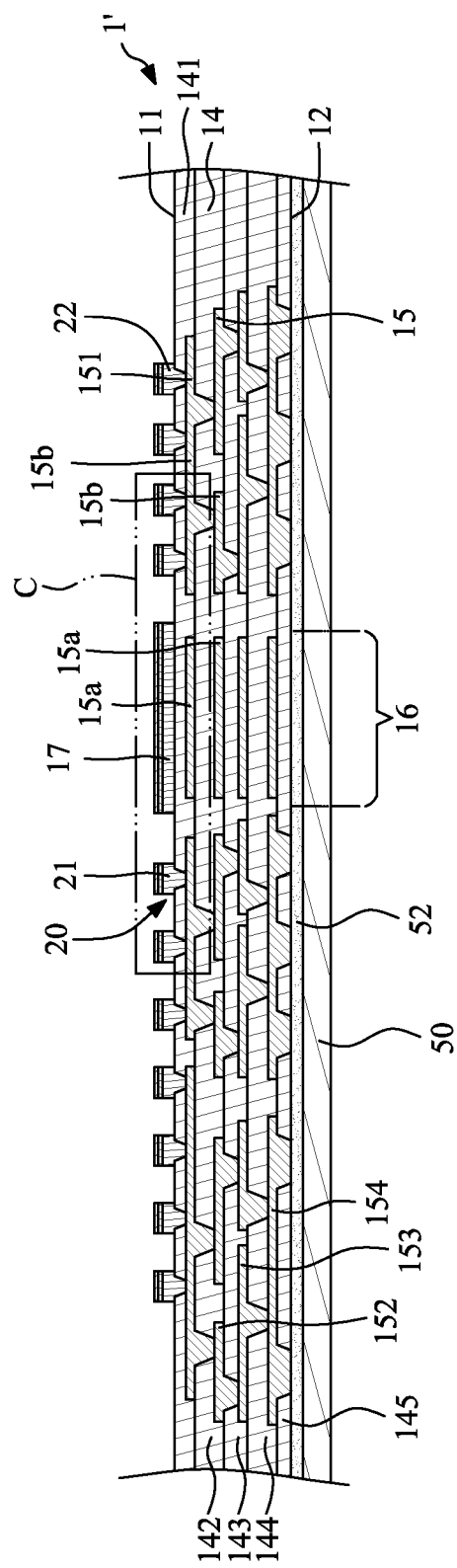
FIG. 18 illustrates one or more stages of an example of a method for manufacturing an assembly structure according to some embodiments of the present disclosure.
Figure 19:
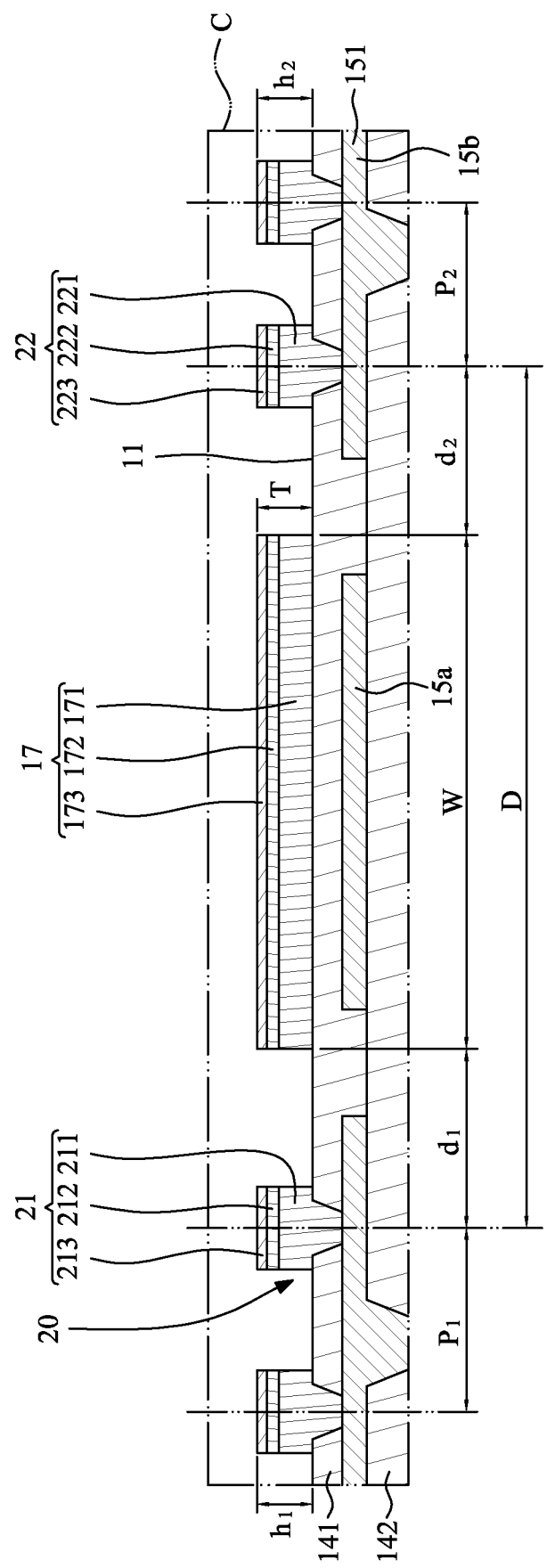
FIG. 19 illustrates an enlarged view of a region "C" in FIG. 18.

Referring to FIG. 18 and FIG. 19, wherein FIG. 19 illustrates an enlarged view of a region "C" in FIG. 18, a carrier 50 is provided. The carrier 50 may be in a wafer type or a strip type. The carrier 50 may include a release layer 52 disposed thereon. Then, a wiring structure 1' is formed or disposed on the release layer 52 on the carrier 50. The wiring structure 1' of FIG. 18 may be similar to the wiring structure 1 of FIG. 2, and may have a first surface 11, a second surface 12 opposite to the first surface 11, and a high density region 16 (or a fine line region). The wiring structure 1' may include at least one dielectric layer 14, at least one circuit layer 15 in contact with the dielectric layer 14, a reinforcement structure 17 and a plurality of protrusion pads 20. For example, as shown in FIG. 18, the wiring structure 1' includes a first dielectric layer 141, a first circuit layer 151, a second dielectric layer 142, a second circuit layer 152, a third dielectric layer 143, a third circuit layer 153, a fourth dielectric layer 144, a fourth circuit layer 154, and a fifth dielectric layer 145. That is, the at least one dielectric layer 14 includes the first dielectric layer 141, the second dielectric layer 142, the third dielectric layer 143, the fourth dielectric layer 144 and the fifth dielectric layer 145. The at least one circuit layer 15 includes the first circuit layer 151, the second circuit layer 152, the third circuit layer 153 and the fourth circuit layer 154.

The first dielectric layer 141 may be a topmost dielectric layer or an outermost dielectric layer of the wiring structure 1. The first circuit layer 151 may be a topmost circuit layer or an outermost circuit layer of the wiring structure 1. Further, the first circuit layer 151 may include an interconnection portion 15a and a periphery portion 15b. The interconnection portion 15a is located in the high density region 16, and the periphery portion 15b is located outside the high density region 16 (e.g., a low density region). A line width/line space (L/S) of the traces of the interconnection portion 15a may be less than an L/S of the traces of the periphery portion 15b.

The protrusion pads 20 may be disposed on and protrude from the first dielectric layer 141 (e.g., the topmost dielectric layer or the outermost dielectric layer) of the wiring structure 1'. The protrusion pads 20 may be disposed on and protrude from the first surface 11 of the wiring structure 1', and extend through the first dielectric layer 141 (e.g., the topmost dielectric layer or the outermost dielectric layer) to electrically connect the first circuit layer 151. The protrusion pads 20 may include a plurality of first protrusion pads 21 and a plurality of second protrusion pads 22.

The reinforcement structure 17 is disposed above the interconnection portion 15a of the circuit layer 15 so as to protect the interconnection portion 15a of the circuit layer 15. As shown in FIG. 18 and FIG. 19, the reinforcement structure 17 may be disposed on and protrude from the first surface 11 of the wiring structure 1'. Further, the reinforcement structure 17 may be disposed on the high density region 16. As shown in FIG. 19, a material of the protrusion pads 20 (including the first protrusion pads 21 and the second protrusion pads 22) may be the same as a material of the reinforcement structure 17, and a thickness T of the reinforcement structure 17 may be substantially equal to a height of the protrusion pad 20 (including a height h1 of the first protrusion pad 21 and a height h2 of the second protrusion pad 22), since they may be formed concurrently in a same process stage.

In some embodiments, the first protrusion pad 21 may include a first metal layer 211, a second metal layer 212 and a third metal layer 213 sequentially disposed on the first surface 11 of the wiring structure 1'. Similarly, the second protrusion pad 22 may include a first metal layer 221, a second metal layer 222 and a third metal layer 223 sequentially disposed on the first surface 11 of the wiring structure 1'. In addition, the reinforcement structure 17 may include a first metal layer 171, a second metal layer 172 and a third metal layer 173 sequentially disposed on the first surface 11 of the wiring structure 1'. The first metal layers 211, 221, 171 are formed concurrently. The second metal layers 212, 222, 172 are formed concurrently. The third metal layers 213, 223, 173 are formed concurrently.

A width of the reinforcement structure 17 is defined as "W", a first distance between the centers of the first protrusion pads 21 is defined as "$P_1$", a second distance between the centers of the second protrusion pads 22 is defined as "$P_2$", a left distance between a left lateral surface of the reinforcement structure 17 and a center of the first protrusion pad 21 nearest to the reinforcement structure 17 is defined as "$d_1$", a right distance between a right lateral surface of the reinforcement structure 17 and a center of the second protrusion pad 22 nearest to the reinforcement structure 17 is defined as "$d_2$", and a distance between the nearest pair of first protrusion pad 21 and second protrusion pad 22 is defined as "D". Thus, "W" is equal to $[D-(d_1+d_2)]$. In some embodiments, "$d_1$" is greater than or equal to "$P_1$", and "$d_2$" is greater than or equal to "$P_2$" so as to prevent a short circuit between the reinforcement structure 17 and the protrusion pads 20 (including the first protrusion pads 21 and the second protrusion pads 22). Thus, "W" is less than or equal to $[D-(P_1+P_2)]$. That is, a maximum value of "W" is equal to $[D-(P_1+P_2)]$. In addition, a minimum value of "W" is equal to 30 μm. That is, the width W of the reinforcement structure 17 is greater than or equal to 30 μm. In some embodiments, the width W of the reinforcement structure 17 is in a range of 210 μm~350 μm.

Figure 20:
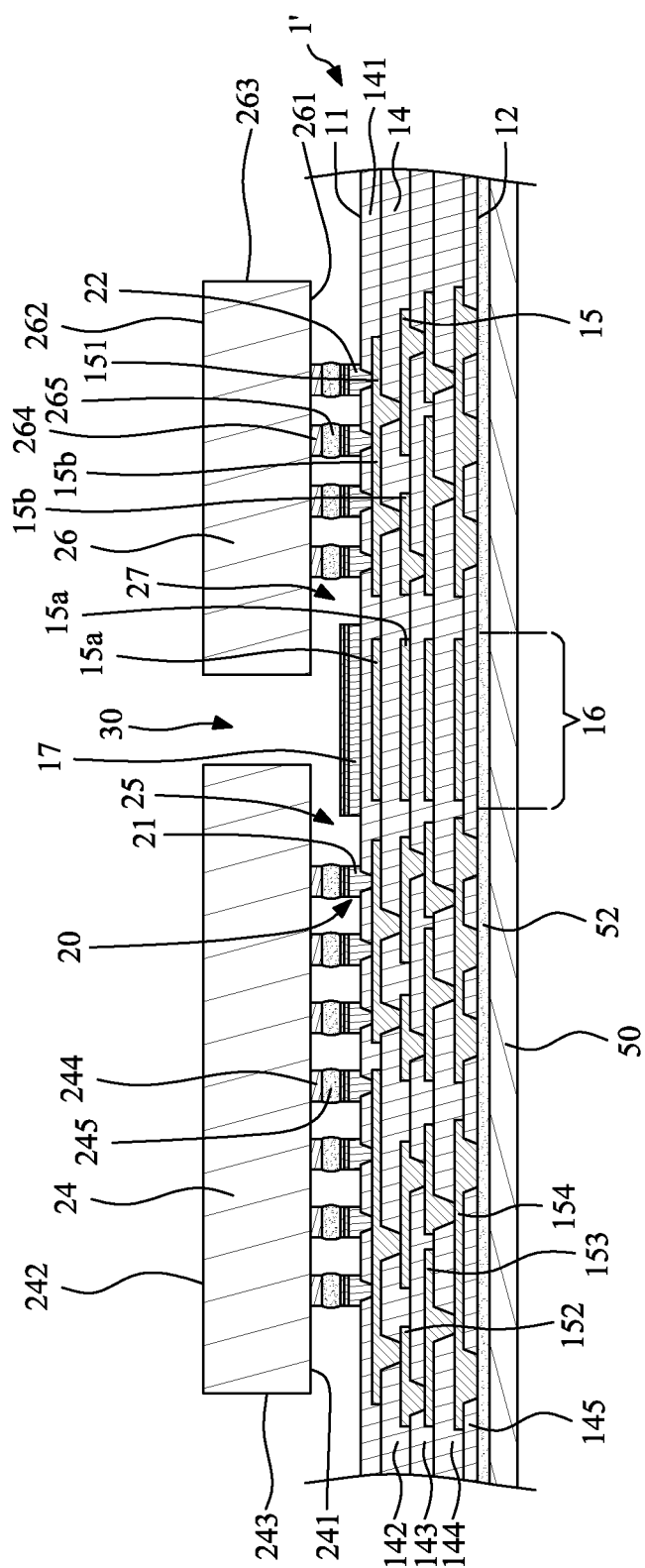
FIG. 20 illustrates one or more stages of an example of a method for manufacturing an assembly structure according to some embodiments of the present disclosure.

Referring to FIG. 20, a first electronic device 24 and a second electronic device 26 are electrically connected to the circuit layer 15 of the wiring structure 1' by flip-chip bonding. Thus, the second electronic device 26 may be electrically connected to the first electronic device 24 through the interconnection portion 15a of the circuit layer 15 (including, for example, the interconnection portions 15a of the first circuit layer 151, the second circuit layer 152, the third circuit layer 153 and the fourth circuit layer 154). The first electronic device 24 may have a first active surface 241, a first backside surface 242 opposite to the first active surface 241, and a lateral surface 243 extending between the first active surface 241 and the first backside surface 242. Further, the first electronic device 24 may include a plurality of first electrical contacts 244 disposed adjacent to the first active surface 241. In some embodiments, the first electrical contacts 244 of the first electronic device 24 may be electrically connected and physically connected to the first protrusion pads 21 through a plurality of solder materials 245. The second electronic device 26 may have a second active surface 261, a second backside surface 262 opposite to the second active surface 261, and a lateral surface 263 extending between the second active surface 261 and the second backside surface 262. Further, the second electronic device 26 may include a plurality of second electrical contacts 264 disposed adjacent to the second active surface 261. In some embodiments, the second electrical contacts 264 of the second electronic device 26 may be electrically connected and physically connected to the second protrusion pads 22 through a plurality of solder materials 265.

Figure 21:
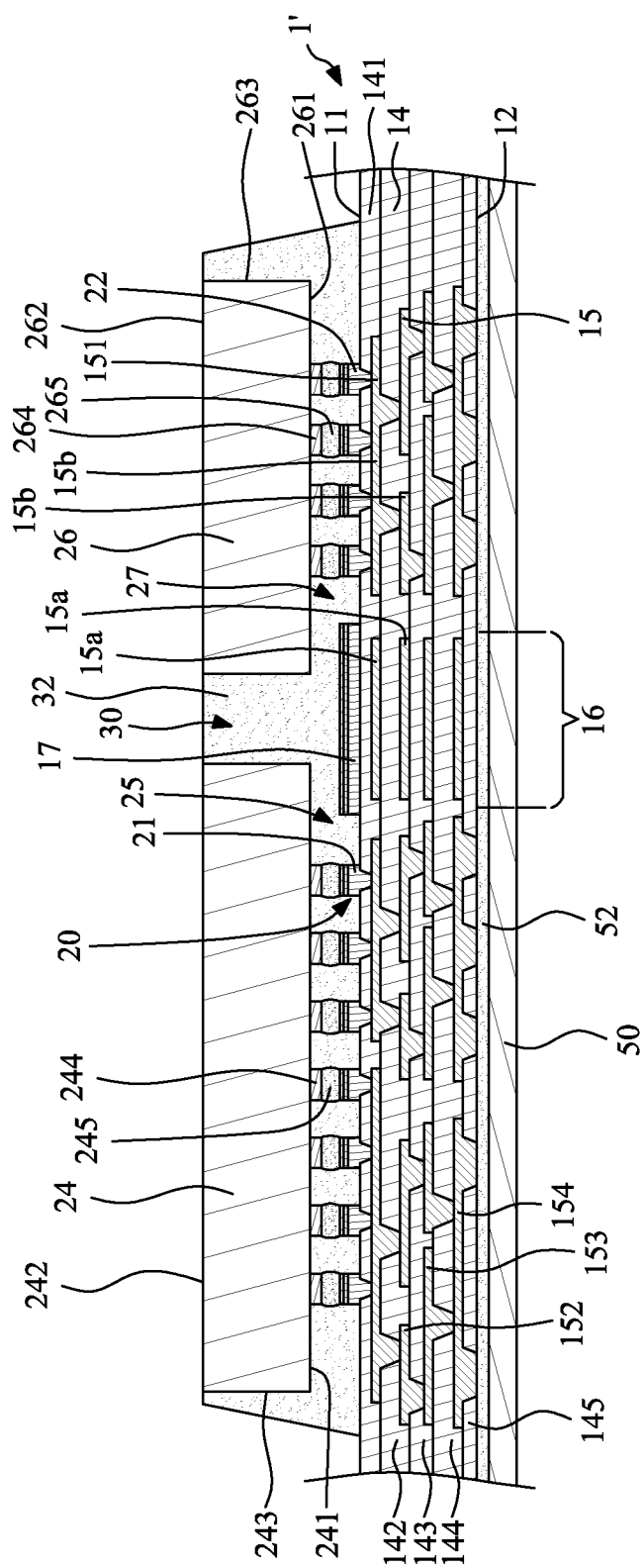
FIG. 21 illustrates one or more stages of an example of a method for manufacturing an assembly structure according to some embodiments of the present disclosure.

Referring to FIG. 21, a first protection material 32 (e.g., an underfill) is formed or disposed in a first space 25 between the first electronic device 24 and the wiring structure 1' and a second space 27 between the second electronic device 26 and the wiring structure 1' so as to cover and protect the reinforcement structure 17, the joints formed by the first electrical contacts 244, the first protrusion pads 21 and the solder materials 245, and the joints formed by the second electrical contacts 264, the second protrusion pads 22 and the solder materials 265. In addition, the first protection material 32 may further extend into a gap 30 between the lateral surface 243 of the first electronic device 24 and the lateral surface 263 of the second electronic device 26.

Figure 22:
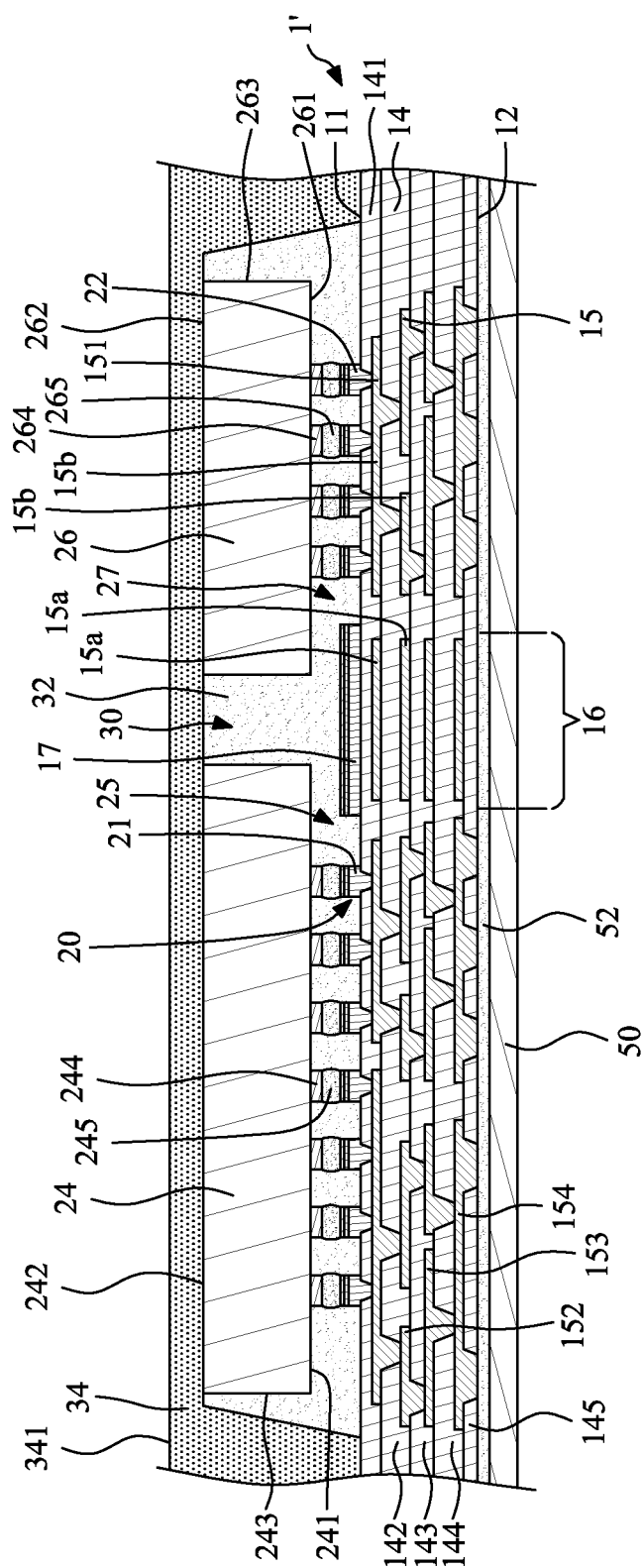
FIG. 22 illustrates one or more stages of an example of a method for manufacturing an assembly structure according to some embodiments of the present disclosure.

Referring to FIG. 22, an encapsulant 34 is formed or disposed to cover at least a portion of the first surface 11 of the wiring structure 1', at least a portion of the first electronic device 24, at least a portion of the second electronic device 26 and the first protection material 32. The encapsulant 34 has a first surface 341 (e.g., a top surface).

Figure 23:
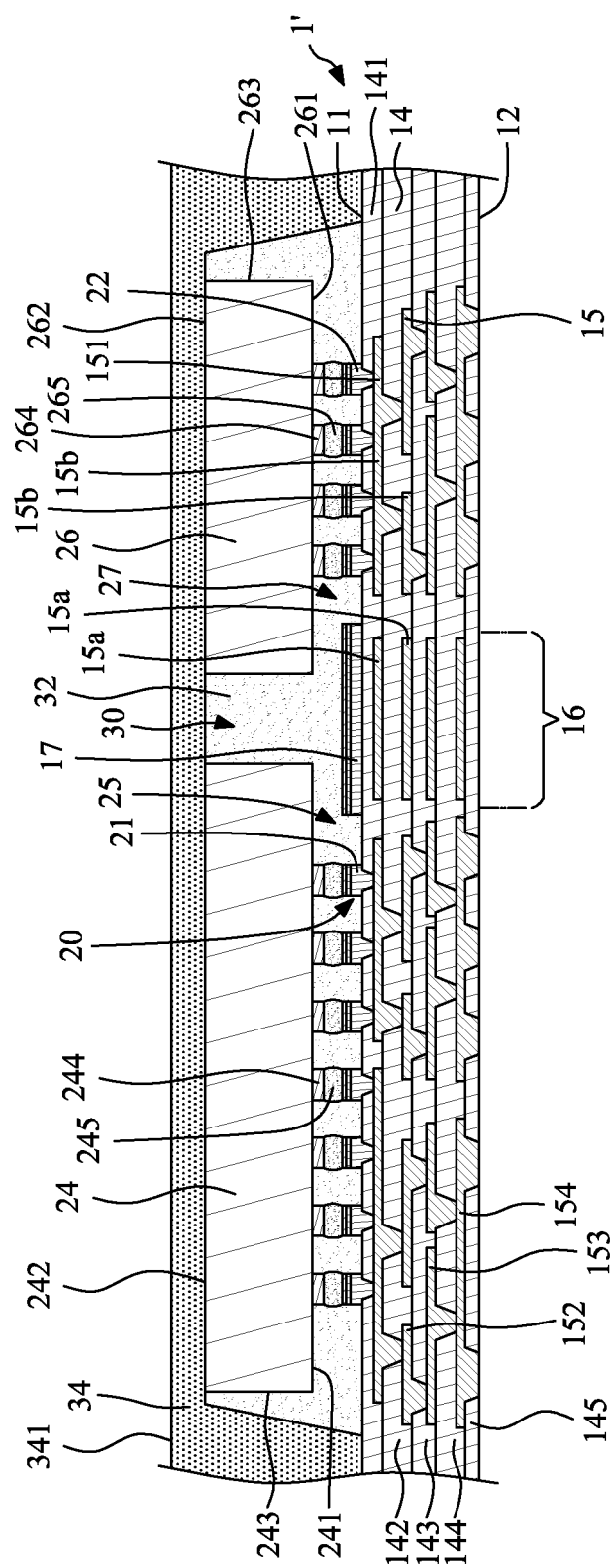
FIG. 23 illustrates one or more stages of an example of a method for manufacturing an assembly structure according to some embodiments of the present disclosure.

Referring to FIG. 23, the carrier 50 and the release layer 52 are removed. Thus, portions (e.g., the bottom portions of the via portions) of the fourth circuit layer 154 are exposed from the second surface 12 of the wiring structure 1'.

Figure 24:
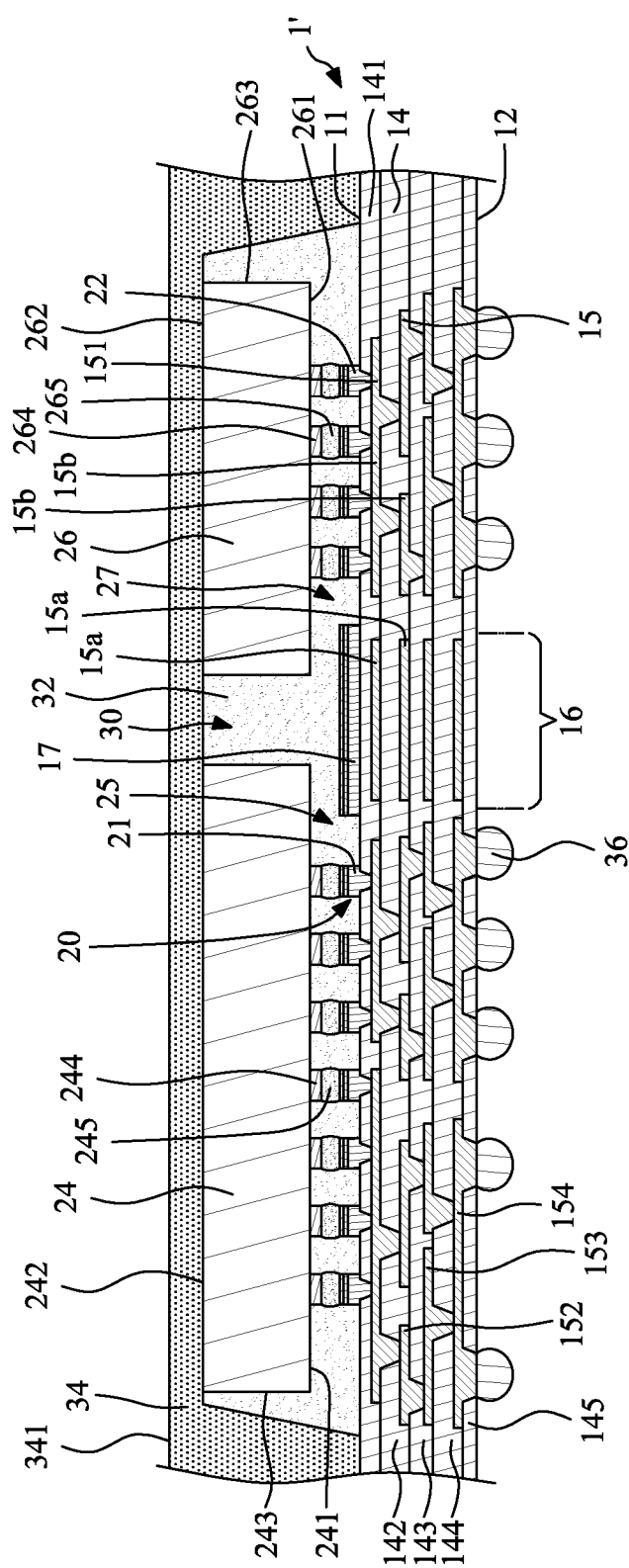
FIG. 24 illustrates one or more stages of an example of a method for manufacturing an assembly structure according to some embodiments of the present disclosure.

Referring to FIG. 24, a plurality of solder materials 36 (e.g., solder balls) are formed or disposed to the second surface 12 of the wiring structure 1'. As shown in FIG. 24, the solder materials 36 are disposed on the exposed portions (e.g., the bottom portions of the via portions) of the fourth circuit layer 154.

Figure 25:
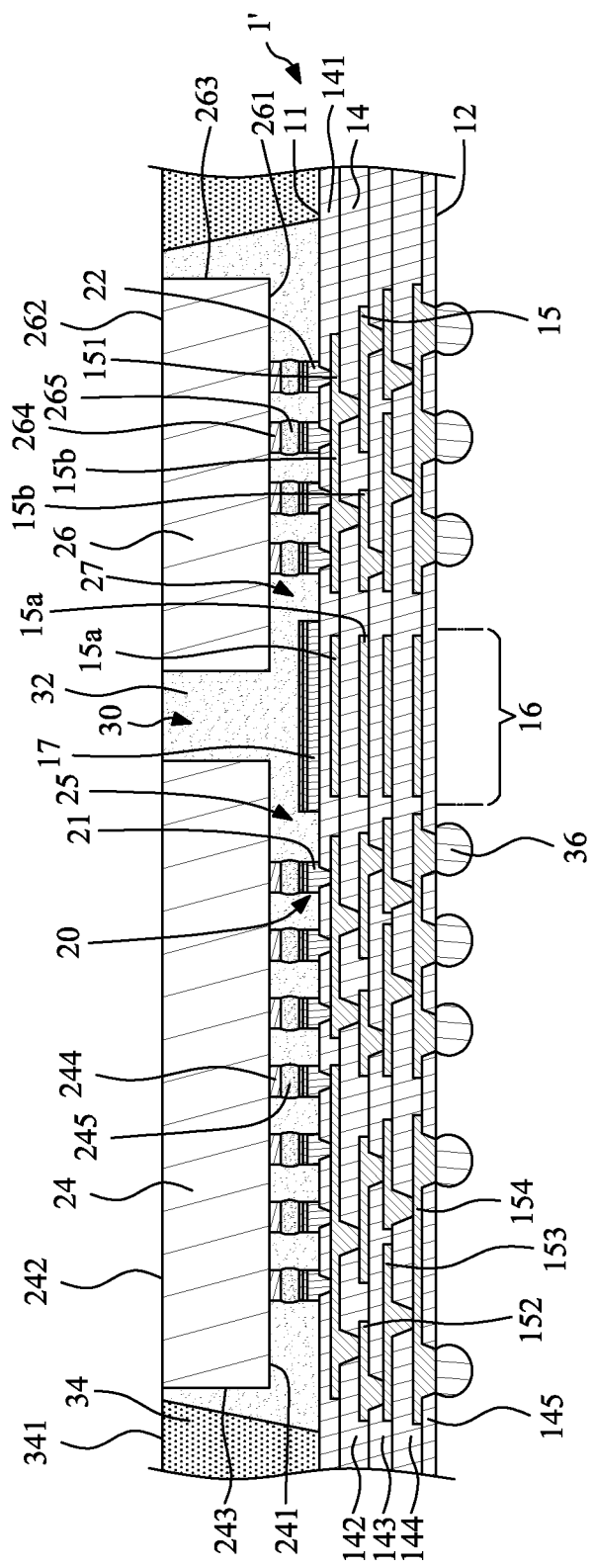
FIG. 25 illustrates one or more stages of an example of a method for manufacturing an assembly structure according to some embodiments of the present disclosure.

Referring to FIG. 25, the encapsulant 34 is thinned from its first surface 341. Thus, the first surface 341 of the encapsulant 34, the first backside surface 242 of the first electronic device 24, the second backside surface 262 of the second electronic device 26 and a top surface of the first protection material 32 in the gap 30 may be substantially coplanar with each other.

In some embodiments, a singulation process may be conducted to the wiring structure 1' so as to obtain a plurality of package structures 3 shown in FIG. 1 to FIG. 4.

Figure 26:
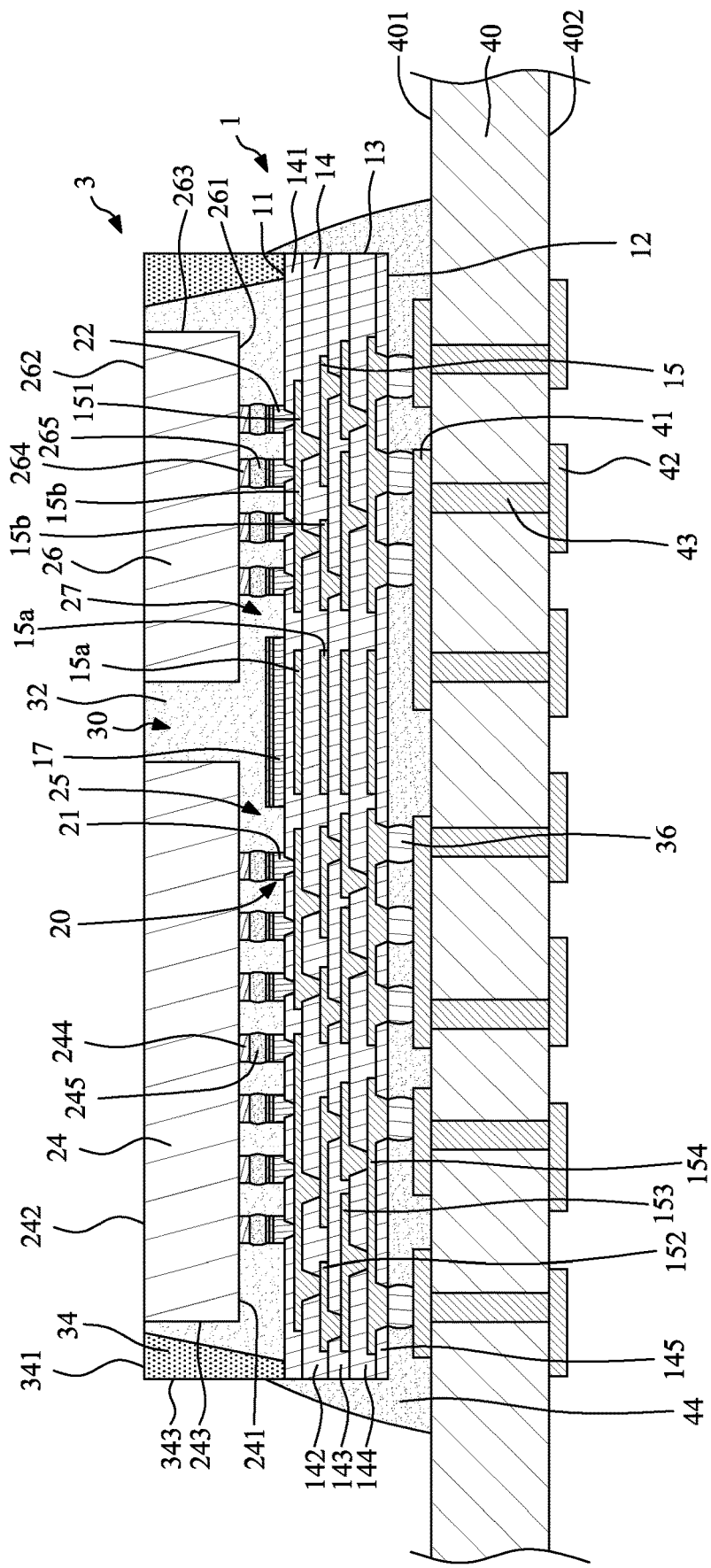
FIG. 26 illustrates one or more stages of an example of a method for manufacturing an assembly structure according to some embodiments of the present disclosure.

Referring to FIG. 26, the package structure 3 may be electrically connected to a first circuit layer 41 of a base substrate 40 through the solder materials 36. The base substrate 40 may have a first surface 401 and a second surface 402 opposite to the first surface 401. The base substrate 40 may include a first circuit layer 41, a second circuit layer 42, and a plurality of conductive vias 43. The first circuit layer 41 may be disposed adjacent to the first surface 401 of the base substrate 40, and the second circuit layer 42 may be disposed adjacent to the second surface 402 of the base substrate 40. The conductive vias 43 may extend through the base substrate 40 and electrically connect the first circuit layer 41 and the second circuit layer 42.

Then, a second protection material 44 (e.g., an underfill) is formed or disposed in a space between the package structure 3 and the base substrate 40 so as to cover and protect the solder materials 36 and the first circuit layer 41.

Then, a heat sink 46 may be attached to the first electronic device 24, the second electronic device 26 and the base substrate 40. In some embodiments, the heat sink 46 may be a cap or hat structure, and may define a cavity 461 for accommodating the package structure 3. A portion of the heat sink 46 may be attached to the top surface of the package structure 3 through a thermal material 48 (e.g., thermal interface material (TIM)). Another portion (e.g., bottom portion) of the heat sink 46 may be attached to the base substrate 40 through an adhesive material. Then, a plurality of external connectors 49 (e.g., solder balls) may be formed or disposed on the second circuit layer 42 for external connection.

Then, a singulation process may be conducted to the wiring structure 1' so as to obtain a plurality of assembly structures 4 shown in FIG. 17.

Figure 27:
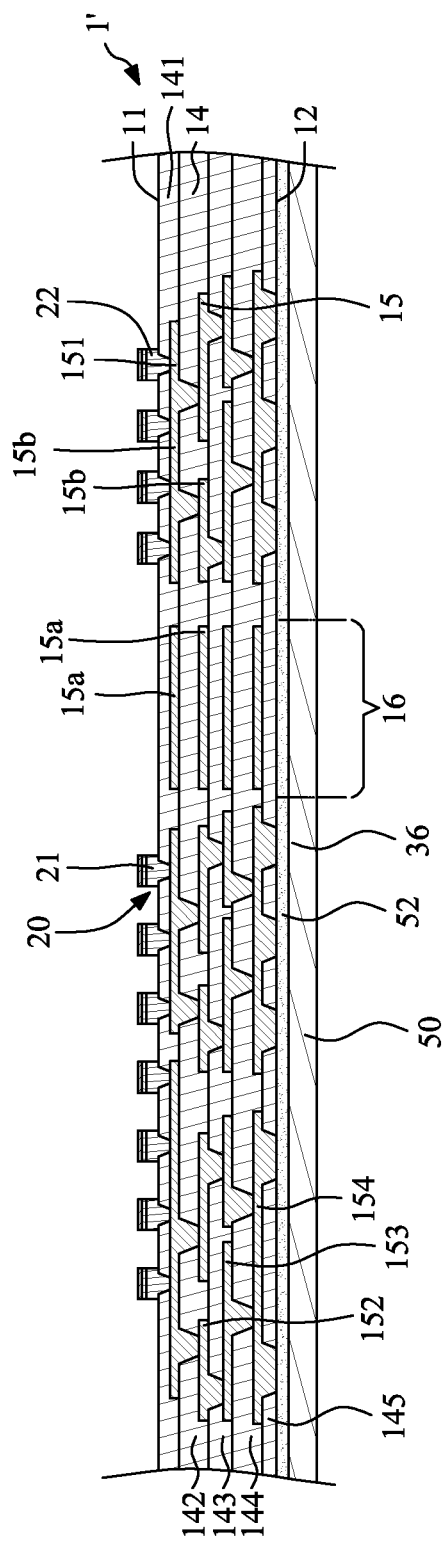
FIG. 27 illustrates one or more stages of an example of a method for manufacturing a package structure according to some embodiments of the present disclosure.
Figure 28:
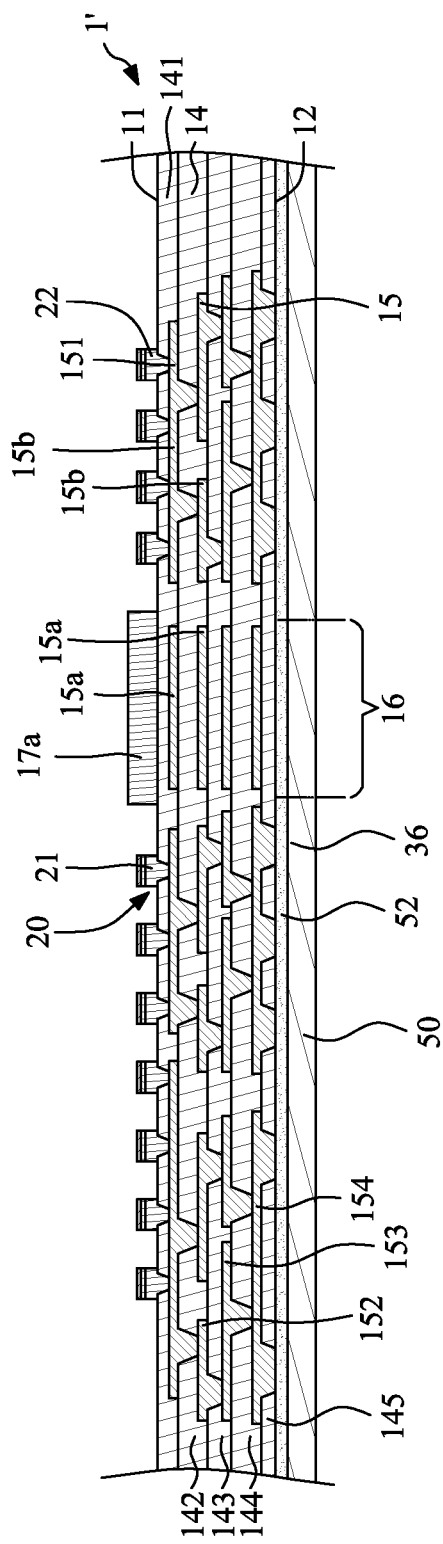
FIG. 28 illustrates one or more stages of an example of a method for manufacturing a package structure according to some embodiments of the present disclosure.

FIG. 27 through FIG. 28 illustrate a method for manufacturing a package structure according to some embodiments of the present disclosure. In some embodiments, the method is for manufacturing the package structure 3a shown in FIG. 5.

Referring to FIG. 27, a carrier 50 is provided. The carrier 50 may include a release layer 52 disposed thereon. Then, a wiring structure 1' is formed or disposed on the release layer 52 on the carrier 50. The wiring structure 1' of FIG. 27 may be similar to the wiring structure 1' of FIG. 18, except that the wiring structure 1' of FIG. 27 does not include the reinforcement structure 17. The wiring structure 1' of FIG. 27 may have a first surface 11, a second surface 12 opposite to the first surface 11, and a high density region 16 (or a fine line region). The wiring structure 1' may include at least one dielectric layer 14, at least one circuit layer 15 in contact with the dielectric layer 14 and a plurality of protrusion pads 20. For example, as shown in FIG. 27, the wiring structure 1' includes a first dielectric layer 141, a first circuit layer 151, a second dielectric layer 142, a second circuit layer 152, a third dielectric layer 143, a third circuit layer 153, a fourth dielectric layer 144, a fourth circuit layer 154, and a fifth dielectric layer 145. The first dielectric layer 141 may be a topmost dielectric layer or an outermost dielectric layer of the wiring structure 1. The first circuit layer 151 may be a topmost circuit layer or an outermost circuit layer of the wiring structure 1. Further, the first circuit layer 151 may include an interconnection portion 15a and a periphery portion 15b. The interconnection portion 15a is located in the high density region 16, and the periphery portion 15b is located outside the high density region 16 (e.g., a low density region). A line width/line space (L/S) of the traces of the interconnection portion 15a may be less than an L/S of the traces of the periphery portion 15b.

The protrusion pads 20 may be disposed on and protrude from the first dielectric layer 141 (e.g., the topmost dielectric layer or the outermost dielectric layer) of the wiring structure 1'. The protrusion pads 20 may be disposed on and protrude from the first surface 11 of the wiring structure 1', and extend through the first dielectric layer 141 (e.g., the topmost dielectric layer or the outermost dielectric layer) to electrically connect the first circuit layer 151. The protrusion pads 20 may include a plurality of first protrusion pads 21 and a plurality of second protrusion pads 22.

Referring to FIG. 28, a reinforcement structure 17a may be formed or disposed on the first surface 11 of the wiring structure 1' to cover the high density region 16. Thus, the reinforcement structure 17a may be formed or disposed above the interconnection portion 15a of the circuit layer 15 so as to protect the interconnection portion 15a of the circuit layer 15. In some embodiments, the reinforcement structure 17a is formed after the formation of the protrusion pads 20 (including the first protrusion pads 21 and the second protrusion pads 22). Thus, a material of the protrusion pads 20 (including the first protrusion pads 21 and the second protrusion pads 22) may be different from a material of the reinforcement structure 17a, and a thickness of the reinforcement structure 17a may be different from a height of the protrusion pad 20. That is, the reinforcement structure 17a may be a single layered metal layer, the thickness of the reinforcement structure 17a may be greater than or less than a height of the protrusion pad 20. Therefore, the thickness of the reinforcement structure 17a may be controlled to a desired value or a predetermined value. In addition, a width of the reinforcement structure 17a may be substantially equal to the width W of the reinforcement structure 17 of FIG. 19.

Then, a singulation process may be conducted to the wiring structure 1' so as to obtain a plurality of package structures 3a shown in FIG. 5.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A package structure, comprising:
   a wiring structure having a top surface;
   a first electronic device disposed adjacent to the top surface of the wiring structure;
   a second electronic device disposed adjacent to the top surface of the wiring structure, wherein the first electronic device and the second electronic device collectively define a gap therebetween;
   a metal layer disposed over the wiring structure and under the gap, wherein in a cross section, the metal layer does not overlap the first electronic device in a first direction perpendicular to the top surface of the wiring structure, and the metal layer overlaps the second electronic device in the first direction; and
   an underfill encapsulating the metal layer,
   wherein both of the first electronic device and the second electronic device overlap the underfill in the first direction,
   and wherein the second electronic device includes an electrical contact protruding beyond an active surface of the second electronic device facing the wiring structure; and
   a solder material disposed between the electrical contact and the wiring structure,
   wherein the electrical contact has a bottom surface facing the wiring structure, wherein the metal layer is lower than an elevation of the bottom surface of the electrical contact with respect to the top surface of the wiring structure.

2. A package structure, comprising:
   a wiring structure;
   a first electronic device disposed over the wiring structure;
   a plurality of second electronic devices disposed over the wiring structure; and
   a metal layer disposed over the wiring structure, wherein in a top view, a first one of the plurality of second electronic devices has a first lateral side surface facing a second lateral side surface of a second one of the plurality of second electronic devices, and the metal layer overlaps the first lateral side surface and the second lateral side surface, wherein the metal layer includes a plurality of blocks spaced apart from each other and arranged in an array, wherein the plurality of blocks do not physically connect each other in the top view.

3. The package structure of claim 1, wherein the metal layer has a first lateral surface under the second electronic device and facing a second protrusion pad over the top surface of the wiring structure, wherein the second protrusion pad is under the electrical contact, wherein in the cross section, the second electronic device has a central axis adjacent to a center of the second electronic device and extending along the first direction, wherein in a second direction parallel with the top surface of the wiring structure, a first distance between the first lateral surface of the metal layer and an imaginary extension of an inner lateral surface of the second electronic device facing the first electronic device is less than a second distance between the first lateral surface of the metal layer and the central axis of the second electronic device.

4. The package structure of claim 3 wherein in the cross section, the wiring structure includes a plurality of first protrusion pads over the top surface of the wiring structure and under the first electronic device, wherein a first one of the plurality of first protrusion pads is most adjacent to the metal layer, wherein in the second direction, a width of the metal layer is less than a third distance between the first one of the plurality of first protrusion pads and the metal layer.

5. The package structure of claim 1, wherein the metal layer includes a plurality of metal sublayers stacked on one another along the first direction, and a total thickness of the plurality of metal sublayers is greater than a thickness of the electrical contact of the second electronic device.

6. The package structure of claim 1, wherein the metal layer includes a first metal sublayer and a second metal sublayer stacked on the first metal sublayer in the first direction, wherein a material of the first metal sublayer is different from a material of the second metal sublayer.

7. The package structure of claim 6, wherein the metal layer further includes a third metal sublayer stacked on the second metal sublayer in the first direction, wherein a material of the third metal sublayer is different from the material of the second metal sublayer.

8. The package structure of claim 7, wherein the wiring structure includes a plurality of circuit layers and a first via disposed between the plurality of circuit layers, wherein a thickness of the third metal sublayer of the metal layer is less than a thickness of one of the plurality of circuit layers.

9. The package structure of claim 8, wherein the wiring structure further includes a second via disposed under the plurality of circuit layers, wherein a width of the second via is different from a width of the first via.

10. A package structure, comprising:
a wiring structure having a top surface;
a first electronic device disposed adjacent to the top surface of the wiring structure;
a second electronic device disposed adjacent to the top surface of the wiring structure, wherein the first electronic device and the second electronic device collectively define a gap therebetween;
a metal layer disposed over the wiring structure and under the gap, wherein in a cross section, the metal layer does not overlap the first electronic device in a first direction perpendicular to the top surface of the wiring structure, and the metal layer overlaps the second electronic device in the first direction;
an underfill encapsulating the metal layer,
wherein both of the first electronic device and the second electronic device overlap the underfill in the first direction; and
a molding compound encapsulating the metal layer and the underfill, wherein a top surface of the molding compound is substantially co-level with a top surface of the underfill, and a bottom surface of the molding compound is substantially co-level with a bottom surface of the underfill,
wherein the molding compound has an outer lateral surface facing away the underfill and an inner lateral surface facing the underfill, wherein in the cross section, a fourth distance between a top end of the outer lateral surface and a top end of the inner lateral surface is greater than a thickness of the metal layer, wherein both of the outer lateral surface and the inner lateral surface of the molding compound are located at a same side of the metal layer in the cross section.

11. The package structure of claim 1, wherein in the cross section, the metal layer includes a first portion disposed within a projection of the second electronic device along the first direction, and wherein a width of the first portion of the metal layer is less than a width of the gap.

12. The package structure of claim 2, wherein in the top view, a first pitch between the plurality of blocks arranged along a third direction parallel with a lateral surface of the first electronic device is substantially equal to a second pitch between the plurality of blocks arranged along a fourth direction perpendicular to the third direction.

13. The package structure of claim 12, wherein in the top view, a size of a first one of the plurality of blocks is substantially equal to a size of a second one of the plurality of blocks.

14. The package structure of claim 13, wherein in the top view, a shape of the first one of the plurality of blocks is substantially same to a shape of the second one of the plurality of blocks.

15. The package structure of claim 14, wherein the plurality of blocks of the metal layer are at least arranged in a 3×6 array.

16. The package structure of claim 2, further comprising:
a molding compound encapsulating the first electronic device and the plurality of second electronic devices, wherein a second top surface of the first one of the plurality of second electronic devices is exposed by a top surface of the molding compound.

17. The package structure of claim 16, wherein in a cross section, the molding compound does not contact a top end of a second lateral surface of the first one of the plurality of second electronic devices.

18. The package structure of claim 2, wherein in a cross section, a first gap is formed between the first one of the plurality of second electronic devices and the second one of the plurality of second electronic devices, a second gap is formed between the first one of the plurality of second electronic devices and the metal layer, wherein a first width of the first gap in a second direction parallel with a top surface of the wiring structure is greater than a second width of the second gap in a first direction perpendicular to the top surface of the wiring structure.

* * * * *